US012671444B2

(12) United States Patent
Kokubun et al.

(10) Patent No.: US 12,671,444 B2
(45) Date of Patent: Jun. 30, 2026

(54) ARITHMETIC CIRCUIT, MEMORY SYSTEM, AND METHOD OF CONTROLLING NONVOLATILE MEMORY

(71) Applicant: Kioxia Corporation, Tokyo (JP)

(72) Inventors: Naoaki Kokubun, Yokohama Kanagawa (JP); Yuki Kondo, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 14 days.

(21) Appl. No.: 18/825,077

(22) Filed: Sep. 5, 2024

(65) Prior Publication Data

US 2025/0284586 A1 Sep. 11, 2025

(30) Foreign Application Priority Data

Mar. 6, 2024 (JP) ................................. 2024-033921

(51) Int. Cl.
*H03M 13/15* (2006.01)

(52) U.S. Cl.
CPC ................................. *H03M 13/157* (2013.01)

(58) Field of Classification Search
CPC .................................................. H03M 13/157
See application file for complete search history.

(56) References Cited

U.S. PATENT DOCUMENTS

| | | | | | |
|---|---|---|---|---|---|
| 4,494,234 | A | * | 1/1985 | Patel | ........................ G11B 5/09 |
| | | | | | 714/757 |
| 8,327,242 | B1 | * | 12/2012 | Anholt | .................. H03M 13/45 |
| | | | | | 714/785 |

| | | | | | |
|---|---|---|---|---|---|
| 2007/0124653 | A1 | * | 5/2007 | Conti | ................ H03M 13/3707 |
| | | | | | 714/E11.041 |
| 2010/0332955 | A1 | * | 12/2010 | Anholt | ................ H03M 13/152 |
| | | | | | 714/781 |
| 2011/0072334 | A1 | | 3/2011 | Brauchle et al. | |
| 2012/0290901 | A1 | * | 11/2012 | Kong | .................. G06F 11/1048 |
| | | | | | 714/781 |
| 2016/0036464 | A1 | * | 2/2016 | Hung | .................. H03M 13/151 |
| | | | | | 714/782 |
| 2017/0017544 | A1 | * | 1/2017 | Bandic | ................ G06F 11/1048 |
| 2017/0093433 | A1 | * | 3/2017 | Ilani | .................... H03M 13/153 |
| 2018/0241415 | A1 | | 8/2018 | Langhammer | |
| 2021/0263797 | A1 | | 8/2021 | Moussa et al. | |

* cited by examiner

*Primary Examiner* — Joseph D Torres
(74) *Attorney, Agent, or Firm* — Foley & Lardner LLP

(57) ABSTRACT

In an arithmetic circuit, a first substitution circuit calculates p/2 first evaluation values by using a first input polynomial having first-order to s-th-order coefficients of the error locator polynomial. When the number of errors is t/2 or less, the arithmetic circuit outputs p pieces of information including: error position information calculated from the first evaluation values obtained by substituting p/2 first check values, and error position information calculated from a second evaluation values obtained by substituting the first check values into a second input polynomial having coefficients obtained by converting coefficients of the first input polynomial. When the number of errors is larger than t/2, the arithmetic circuit outputs p/2 pieces of error position information based on the first evaluation values and third evaluation values obtained by converting the second evaluation values obtained by a third polynomial having (s+1)-th-order to t-th-order coefficients of the error locator polynomial.

6 Claims, 15 Drawing Sheets

FIG.4

<div>

CYCLE 1

$$\text{HIT}i = \begin{cases} 1 & \sigma(\alpha^i) = 0 \\ 0 & \sigma(\alpha^i) \neq 0 \end{cases}$$

$$\text{HIT}(i+1) = \begin{cases} 1 & \sigma(\alpha^{i+1}) = 0 \\ 0 & \sigma(\alpha^{i+1}) \neq 0 \end{cases}$$

</div>

<div>

CYCLE 2

$$\text{HIT}i = \begin{cases} 1 & \sigma(\alpha^{i+2}) = 0 \\ 0 & \sigma(\alpha^{i+2}) \neq 0 \end{cases}$$

$$\text{HIT}(i+1) = \begin{cases} 1 & \sigma(\alpha^{i+3}) = 0 \\ 0 & \sigma(\alpha^{i+3}) \neq 0 \end{cases}$$

</div>

$\vdots$

FIG.5

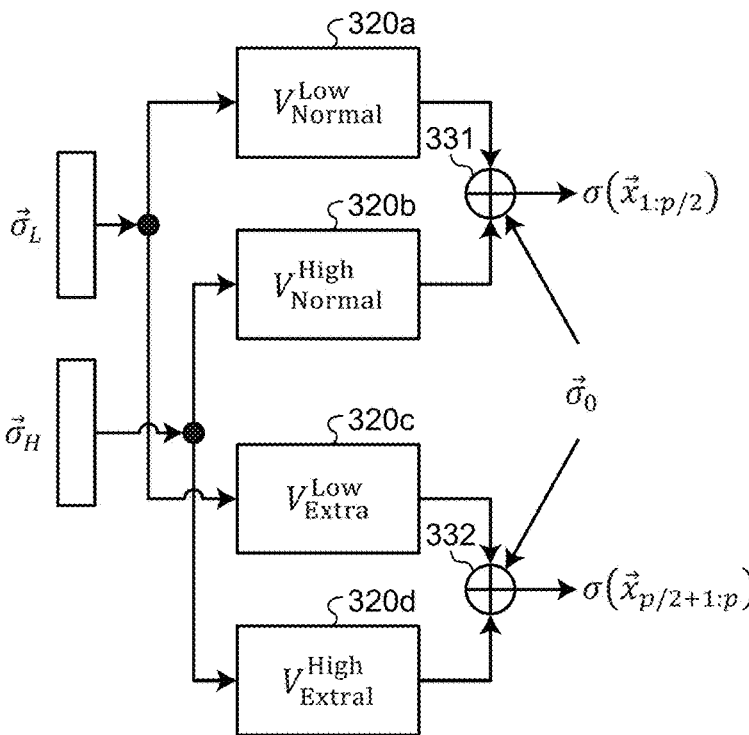

$$\begin{pmatrix} \sigma\left(\vec{x}_{1:p/2}\right) \\ \sigma\left(\vec{x}_{p/2+1:p}\right) \end{pmatrix} = \begin{pmatrix} \vec{\sigma}_0 \\ \vec{\sigma}_0 \end{pmatrix} + \begin{pmatrix} V_{\text{Normal}}^{\text{Low}} & V_{\text{Normal}}^{\text{High}} \\ V_{\text{Extra}}^{\text{Low}} & V_{\text{Extra}}^{\text{High}} \end{pmatrix} \begin{pmatrix} \vec{\sigma}_L \\ \vec{0} \end{pmatrix}$$

$$\begin{pmatrix} \sigma(\vec{x}_{1:p/2}) \\ \sigma(\vec{x}_{p/2+1:p}) \end{pmatrix} = \begin{pmatrix} \vec{\sigma}_0 \\ \vec{\sigma}_0 \end{pmatrix} + \begin{pmatrix} V_{Normal}^{Low} & V_{Normal}^{High} \\ V_{Extra}^{Low} & V_{Extra}^{High} \end{pmatrix} \begin{pmatrix} \vec{\sigma}_L \\ \vec{\sigma}_H \end{pmatrix}$$

$$\begin{pmatrix} \sigma\!\left(\vec{x}_{1:p/2}\right) \\ \sigma\!\left(\vec{x}_{p/2+1:p}\right) \end{pmatrix} = \begin{pmatrix} \vec{\sigma}_0 \\ \vec{\sigma}_0 \end{pmatrix} + \begin{pmatrix} V_{\text{Normal}}^{\text{Low}} & V_{\text{Normal}}^{\text{High}} \\ V_{\text{Extral}}^{\text{Low}} & V_{\text{Extra}}^{\text{High}} \end{pmatrix} \begin{pmatrix} \vec{\sigma}_L \\ \vec{0} \end{pmatrix}$$

$$\left(\sigma(\vec{x}_{1:p/2})\right) = (\vec{\sigma}_0) + \left(V_{Normal}^{Low} \, V_{Normal}^{High}\right)\begin{pmatrix}\vec{\sigma}_L \\ \vec{\sigma}_H\end{pmatrix}$$

FIG.10

$$\begin{pmatrix} \sigma(\vec{x}_{1:p/2}) \\ \sigma(\vec{x}_{p/2+1:p}) \end{pmatrix} = \begin{pmatrix} \vec{\sigma}_0 \\ \vec{\sigma}_0 \end{pmatrix} + \begin{pmatrix} V_{\text{Normal}}^{\text{Low}} V_{\text{Normal}}^{\text{High}} \\ V_{\text{Extra}}^{\text{Low}} V_{\text{Extra}}^{\text{High}} \end{pmatrix} \begin{pmatrix} \vec{\sigma}_L \\ \vec{0} \end{pmatrix}$$

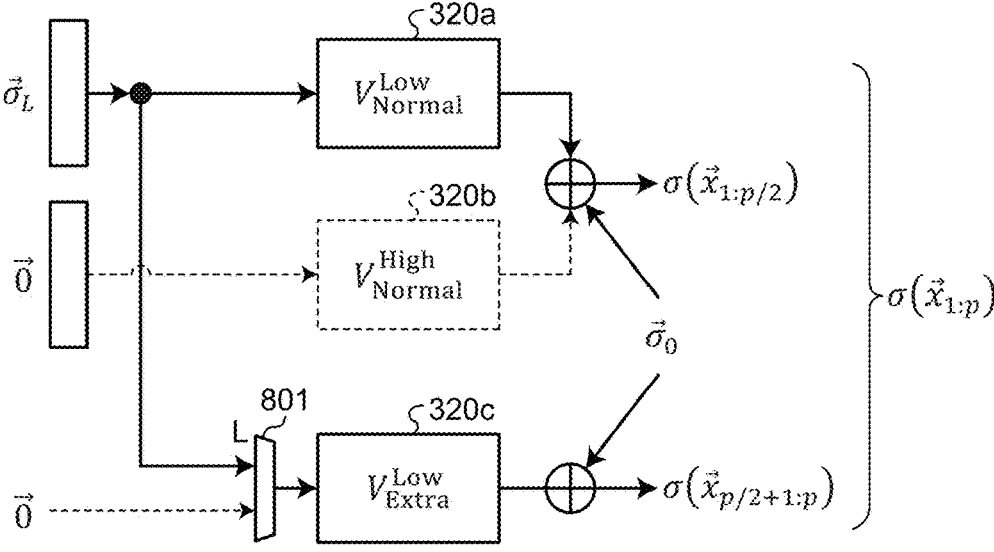

FIG.11

$$\begin{pmatrix} \sigma(\vec{x}_{1:p/2}) \end{pmatrix} = (\vec{\sigma}_0) + \begin{pmatrix} V_{\text{Normal}}^{\text{Low}} V_{\text{Normal}}^{\text{High}} \end{pmatrix} \begin{pmatrix} \vec{\sigma}_L \\ \vec{\sigma}_H \end{pmatrix}$$

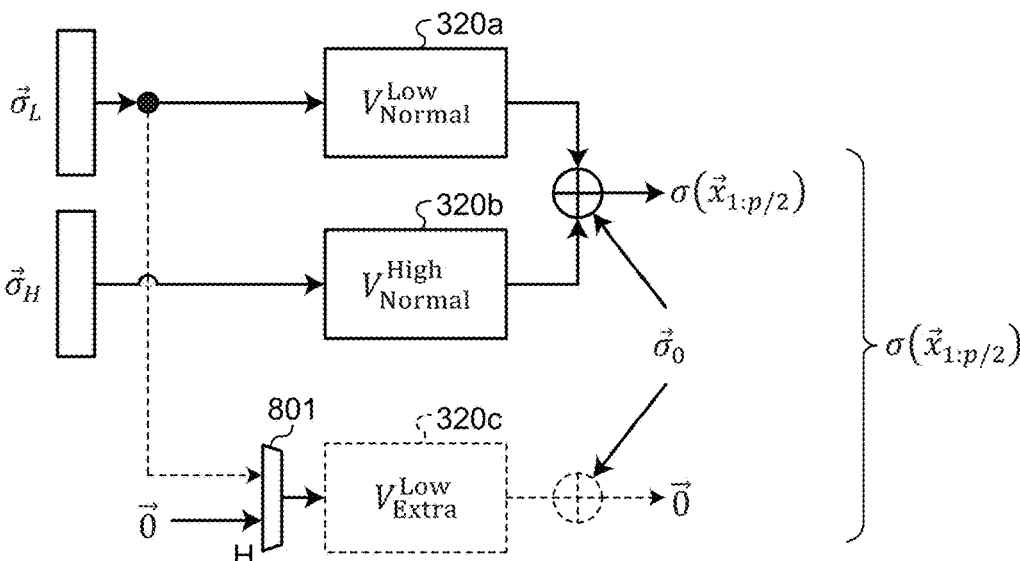

$$\begin{pmatrix} \sigma(\vec{x}_{1:p/2}) \\ \sigma(\vec{x}_{p/2+1:p}) \end{pmatrix} = \begin{pmatrix} \vec{\sigma}_0 \\ \vec{\sigma}_0 \end{pmatrix} + \begin{pmatrix} V_{\text{Normal}}^{\text{Low}} & V_{\text{Normal}}^{\text{High}} \\ V_{\text{Normal}}^{\text{Low}} D_1\left(\frac{t}{2}, \frac{p}{2}\right) & V_{\text{Extra}}^{\text{High}} \end{pmatrix} \begin{pmatrix} \vec{\sigma}_L \\ \vec{0} \end{pmatrix}$$

$$\left(\sigma(\vec{x}_{1:p/2})\right) = (\vec{\sigma}_0) + \left(V_{\text{Normal}}^{\text{Low}} \quad D_2\left(\frac{t}{2},\frac{p}{2}\right) V_{\text{Normal}}^{\text{Low}}\right)\begin{pmatrix}\vec{\sigma}_L\\\vec{\sigma}_H\end{pmatrix}$$

ARITHMETIC CIRCUIT, MEMORY SYSTEM, AND METHOD OF CONTROLLING NONVOLATILE MEMORY

CROSS-REFERENCE TO RELATED APPLICATIONS

This application is based upon and claims the benefit of priority from Japanese Patent Application No. 2024-033921, filed on Mar. 6, 2024, the entire contents of which are incorporated herein by reference.

FIELD

Embodiments described herein relate generally to an arithmetic circuit, a memory system, and a control method.

BACKGROUND

In a memory system, data having been subjected to error correction coding is stored in a memory such as a NAND flash memory in order to protect data stored in the memory. Therefore, when the data stored in the memory is read, the data subjected to error correction coding (also referred to as a received word) read from the memory is decoded to restore data before the error correction coding.

For an error correction code, a decoding technique using the error locator polynomial is known. The Chien search is known as a method of calculating an error position using the error locator polynomial. The Chien search is a method of sequentially substituting a value into the error locator polynomial and searching for the error position based on a value at which an output of the evaluation of the error locator polynomial becomes 0. In decoding processing, the size of an arithmetic circuit for processing of searching for the root of the error locator polynomial such as the Chien search tends to increase.

BRIEF DESCRIPTION OF THE DRAWINGS

FIG. 4 is a diagram for explaining an example of an output of an arithmetic unit;

FIG. 5 is a block diagram illustrating the error position calculation unit of the first configuration example;

FIG. 10 is a diagram for explaining the operation of an error position calculation unit of a third configuration example;

FIG. 11 is a diagram for explaining the operation of the error position calculation unit of the third configuration example;

DETAILED DESCRIPTION

An arithmetic circuit according to an embodiment includes a first substitution circuit and a second substitution circuit. The first substitution circuit is configured to calculate p/2 (p is an even integer satisfying $2 \leq p < n$; n is an integer of 2 or more) first evaluation values by substituting p/2 check values into a first input polynomial. The first input polynomial is represented by first-order to s-th-order (s is the minimum integer greater than or equal to t/2 or the maximum integer less than or equal to t/2; t is an integer of 2 or more) coefficients of the error locator polynomial for an error correction code. The error correction code has a code length of n bits to correct an error of t bits or less. The second substitution circuit is configured to calculate p/2 second evaluation values. The arithmetic circuit is configured to, when the number of errors is t/2 or less, output p pieces of error position information. The p pieces of error position information include: p/2 pieces of error position information calculated based on the first evaluation values calculated by the first substitution circuit by substituting p/2 first check values from the first to the p/2-th among the p check values, and p/2 pieces of error position information calculated based on the second evaluation values calculated by the second substitution circuit by substituting the first check values into a second input polynomial. The second input polynomial is represented by coefficients obtained by converting the coefficients of the first input polynomial. The arithmetic circuit is configured to, when the number of errors is larger than t/2, convert the second evaluation values into third evaluation values. The second evaluation values are calculated by the second substitution circuit by substituting the first check values into a third input polynomial represented by (s+1)-th-order to t-th-order coefficients of the error locator polynomial. Then, the arithmetic circuit outputs p/2 pieces of error position information calculated based on the first evaluation values and the third evaluation values. The first evaluation values are calculated by the first substitution circuit by substituting the first check values.

Hereinafter, a preferred embodiment of an arithmetic circuit according to the present invention will be described in detail with reference to the accompanying drawings. Hereinafter, a memory system including an arithmetic circuit that searches for a root of the error locator polynomial at the time of decoding an error correction code will be described as an example. A configuration using the arithmetic circuit is not limited to this example, and any system (apparatus and device) may be used.

Figure 1:
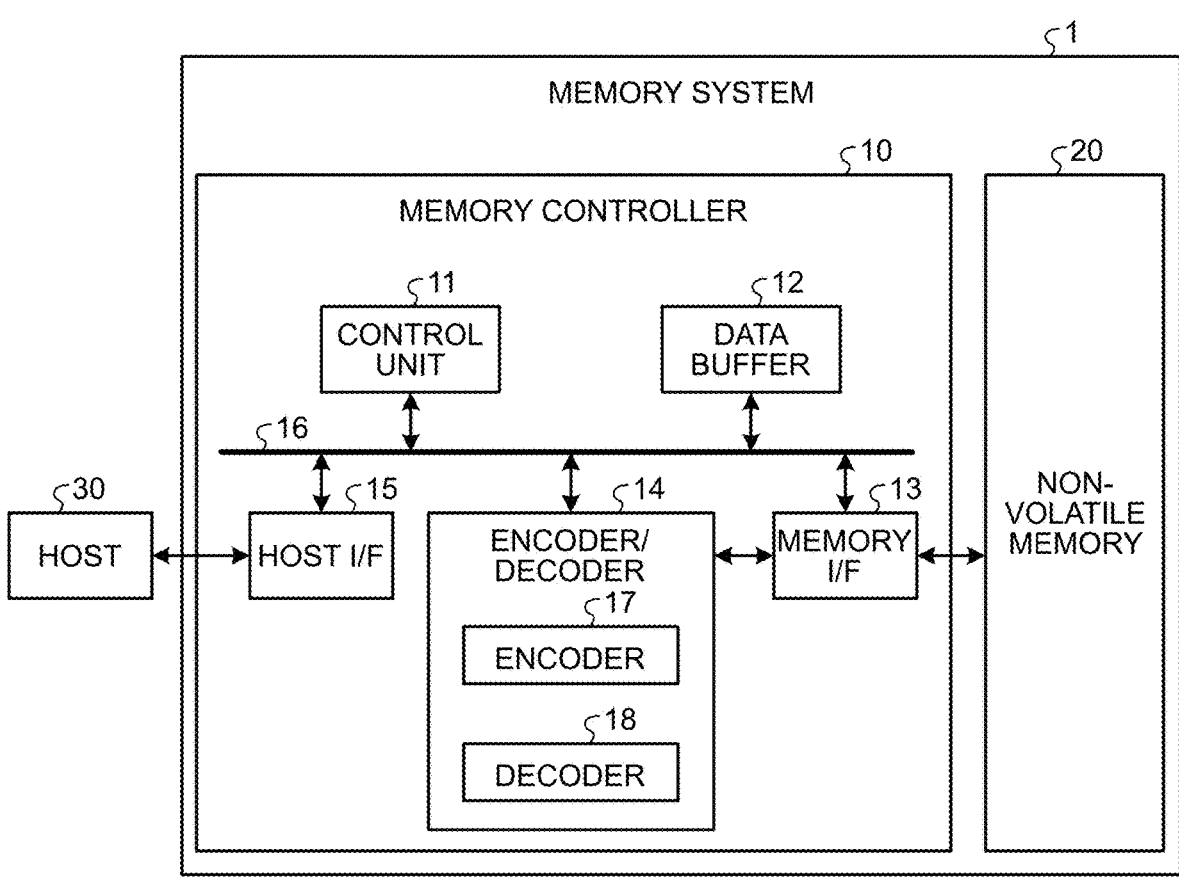
FIG. 1 is a block diagram of a memory system according to an embodiment.

First, a memory system according to the present embodiment will be described in detail with reference to the drawings. FIG. 1 is a block diagram illustrating a schematic configuration example of the memory system according to the present embodiment. As illustrated in FIG. 1, a memory system 1 includes a memory controller 10 and a nonvolatile memory 20. The memory system 1 can be connected to a host 30, and FIG. 1 illustrates a state in which the memory system 1 is connected to the host 30. The host 30 may be, for example, an electronic device such as a personal computer or a mobile terminal.

The nonvolatile memory 20 is a nonvolatile memory that stores data in a nonvolatile manner. The nonvolatile memory 20 is, for example, a NAND flash memory (hereinafter, simply referred to as a NAND memory). In the following description, a case where the NAND memory is used as the nonvolatile memory 20 will be exemplified. However, a storage device other than the NAND memory, such as a three-dimensional structure flash memory, a resistive random access memory (ReRAM), or a ferroelectric random access memory (FeRAM), can be used as the nonvolatile memory 20. Additionally, the nonvolatile memory 20 is not necessarily the semiconductor memory, and the present embodiment can also be applied to various storage media other than the semiconductor memory.

The memory system 1 may be various memory systems including the nonvolatile memory 20, such as a so-called solid state drive (SSD) or a memory card in which the memory controller 10 and the nonvolatile memory 20 are configured as one package.

The memory controller 10 controls writing to the nonvolatile memory 20 in accordance with a write request from the host 30. In addition, the memory controller 10 controls reading from the nonvolatile memory 20 in accordance with a read request from the host 30. The memory controller 10 is, for example, a semiconductor integrated circuit configured as a system on a chip (SoC). The memory controller 10 includes a host interface (host I/F) 15, a memory interface (memory I/F) 13, a control unit 11, an encoder/decoder (Codec) 14, and a data buffer 12. The host I/F 15, the memory I/F 13, the control unit 11, the encoder/decoder 14, and the data buffer 12 are mutually connected by an internal bus 16. Part of or all operations of each component of the memory controller 10 described below may be implemented by executing firmware by a central processing unit (CPU) or may be implemented by hardware.

The host I/F 15 performs processing according to an interface standard with the host 30, and outputs a command received from the host 30, user data to be written, and the like to the internal bus 16. In addition, the host I/F 15 transmits user data read from the nonvolatile memory 20 and restored, a response from the control unit 11, and the like to the host 30.

The memory I/F 13 performs write processing on the nonvolatile memory 20 in accordance with an instruction from the control unit 11. In addition, the memory I/F 13 performs read processing from the nonvolatile memory 20 in accordance with an instruction from the control unit 11.

The control unit 11 integrally controls each component of the memory system 1. When a command is received from the host 30 via the host I/F 15, the control unit 11 performs control according to the command. In one example, the control unit 11 instructs the memory I/F 13 to write the user data and the parity to the nonvolatile memory 20 in accordance with a command from the host 30. In addition, the control unit 11 instructs the memory I/F 13 to read the user data and the parity from the nonvolatile memory 20 in accordance with a command from the host 30.

When a write request is received from the host 30, the control unit 11 determines a storage area (memory area) on the nonvolatile memory 20 for storing the user data accumulated in the data buffer 12. Thus, the control unit 11 manages a write destination of the user data. The correspondence between a logical address of user data received from the host 30 and a physical address indicating the storage location on the nonvolatile memory 20, where the user data is stored, is stored as an address conversion table.

In addition, when a read request is received from the host 30, the control unit 11 converts a logical address designated by the read request into a physical address using the above-described address conversion table, and instructs the memory I/F 13 to perform reading from the physical address.

In the NAND memory, generally, writing and reading are performed in data units called pages, and erasing is performed in data units called blocks. In the present embodiment, a plurality of memory cells connected to the same word line is referred to as a memory cell group. When the memory cell is a single level cell (SLC), one memory cell group corresponds to one page. When the memory cell is a multiple level cell (MLC), one memory cell group corresponds to a plurality of pages. In the present description, the MLC includes a triple level cell (TLC), a quad level cell (QLC), and the like. Each memory cell is connected to a word line and is also connected to a bit line. Therefore, each memory cell can be identified by an address for identifying a word line and an address for identifying a bit line.

The data buffer 12 temporarily stores the user data received from the host 30 by the memory controller 10 until the user data is stored in the nonvolatile memory 20. In addition, the data buffer 12 temporarily stores the user data read from the nonvolatile memory 20 until the user data is transmitted to the host 30. The data buffer 12 may be implemented by a general-purpose memory such as a static random access memory (SRAM) or a dynamic random access memory (DRAM). Note that the data buffer 12 may be provided outside the memory controller 10 without being built in the memory controller 10.

The user data transmitted from the host 30 is transferred to the internal bus 16 and temporarily stored in the data buffer 12. The encoder/decoder 14 generates a code word by encoding the user data stored in the nonvolatile memory 20. The encoder/decoder 14 restores the user data by decoding the received word read from the nonvolatile memory 20. Therefore, the encoder/decoder 14 includes an encoder 17 and a decoder 18. Note that the data encoded by the encoder/decoder 14 may include control data or the like used inside the memory controller 10 in addition to the user data.

Next, the write processing of the present embodiment will be described. The control unit 11 instructs the encoder 17 to encode the user data at the time of writing to the nonvolatile memory 20. At that time, the control unit 11 determines a storage location (storage address) of the code word in the nonvolatile memory 20, and also instructs the memory I/F 13 of the determined storage location.

The encoder 17 encodes the user data on the data buffer 12 in accordance with instruction from the control unit 11 to generate a code word. As an encoding method of example, an encoding method using algebraic codes such as a Bose-Chaudhuri-Hocquenghem (BCH) code and a Reed-Solomon (RS) code, and an encoding method (product code or the like) using these codes as component codes in a row direction and a column direction can be adopted. The memory I/F 13 performs control to store a code word in the storage location on the nonvolatile memory 20 instructed from the control unit 11. Hereinafter, a case where a BCH code for correcting an error of t bits or less is used will be described as an example.

As described below, in the present embodiment, t coefficients of the t-th-order error locator polynomial are divided into two groups: first-order to (t/2)-th-order coefficients and (t/2+1)-th-order to t-th-order coefficients, and calculation is performed on each group.

Next, processing at the time of reading from the nonvolatile memory 20 of the present embodiment will be described. At the time of reading from the nonvolatile memory 20, the control unit 11 designates an address on the nonvolatile memory 20 and instructs the memory I/F 13 to perform reading. The control unit 11 instructs the decoder 18 to start decoding. The memory I/F 13 reads a received word from the designated address of the nonvolatile memory 20 in accordance with an instruction of the control unit 11, and inputs the read received word to the decoder 18. The decoder 18 decodes the received word read from the nonvolatile memory 20.

The decoder 18 decodes the received word read from the nonvolatile memory 20. The decoder 18 calculates the error locator polynomial by using, for example, the Peterson-Gorenstein-Zierler (PGZ) method, the Berlekamp-Massey (BM) method, the Euclidean method, or the like.

Figure 2:
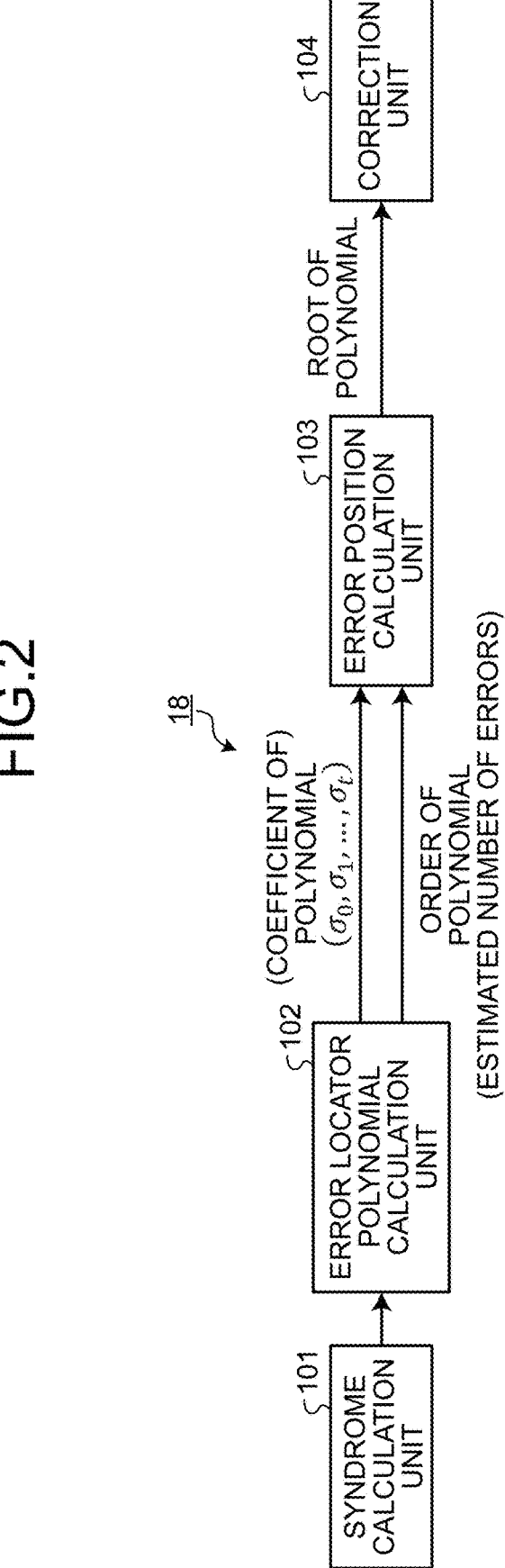
FIG. 2 is a block diagram of a decoder according to the embodiment.

FIG. 2 is a block diagram illustrating a configuration example of the decoder 18 according to the present embodiment. As illustrated in FIG. 2, the decoder 18 includes a syndrome calculation unit 101, the error locator polynomial calculation unit 102, an error position calculation unit 103 as an arithmetic circuit, and a correction unit 104.

The syndrome calculation unit 101 calculates the syndrome using a received word (read sequence) read from the nonvolatile memory 20. The syndrome calculation unit 101 may calculate the syndrome by any conventionally used method. A plurality of syndromes may be calculated depending on the number of corrections. When values of all syndromes are 0, it can be determined that there is no error in the received word, so that the decoder 18 can end the decoding processing without executing subsequent processing.

The error locator polynomial calculation unit 102 calculates the error locator polynomial by the PGZ method, the BM method, the Euclidean method, or the like using the syndrome. A part of the coefficients of the error locator polynomial is calculated by adding and multiplying syndromes.

Note that syndromes and coefficients of the error locator polynomial are elements of the Galois field. The Galois field is a set having $2^m$ (m is an integer of 1 or more) elements and defining four arithmetic operations characterized by a primitive polynomial of order m.

The error locator polynomial calculation unit 102 outputs the coefficient of the calculated error locator polynomial and the order of the error locator polynomial. The order of the error locator polynomial corresponds to the estimated number of errors. A coefficient of the t-th-order error locator polynomial is defined as $\sigma_i$ (i is an integer satisfying $0 \leq i \leq t$). The t-th-order error locator polynomial $\sigma(x)$ is expressed by, for example, the following Formula (1).

$$\sigma(x) = \sigma_0 + \sigma_1 x + \sigma_2 x^2 + \ldots + \sigma_t x^t \qquad (1)$$

The coefficient $\sigma_i$ is an element of the Galois field GF ($2^m$) as shown in the following Formula (2). $\alpha$ is a primitive element of the Galois field. A non-zero element of the Galois field can be expressed by a power of the primitive element $\alpha$.

$$\sigma_i \in GF(2^m) = \left\{ 0, \alpha^0, \alpha^1, \alpha^2, \ldots, \alpha^{2^m-2} \right\} \qquad (2)$$

The following Formula (3) shows an example of the error locator polynomial in a case where t is 6, m is 9 (GF ($2^9$)), and the number of errors is 3. Since the number of errors is 3, the fourth-order to sixth-order coefficients are 0.

$$\sigma(x) = \alpha^{53} + \alpha^7 x + \alpha^{33} x^2 + \alpha^{15} x^3 + 0x^4 + 0x^5 + 0x^6 \qquad (3)$$

The error position calculation unit 103 calculates an error position using the error locator polynomial calculated by the error locator polynomial calculation unit 102. The processing of calculating the error position (search processing) may be implemented by any method. In one example, the Chien search can be used. The Chien search is a method of sequentially substituting a value into the error locator polynomial and searching for an error position based on a value (a root of the error locator polynomial) at which an output value of the error locator polynomial becomes 0.

The correction unit 104 executes error correction by inverting (bit flipping) a bit at the error position calculated by the search processing.

The error position calculation unit 103 is implemented by, for example, a register, an adder, a multiplier, a selector, and other arithmetic units. The syndrome calculation unit 101 and the error locator polynomial calculation unit 102 are also implemented by, for example, a register, an adder, a multiplier, a selector, and other arithmetic units. The correction unit 104 is implemented by, for example, an adder for adding a bit sequence reflecting the error position information output from the error position calculation unit 103 and a read sequence, but may be implemented by other arithmetic units. Here, the bit sequence reflecting the error position information is, for example, a sequence in which outputs HITi of an arithmetic unit 341 described later are arranged. The register is implemented by, for example, a logic circuit such as a flip-flop. The adder, the multiplier, the selector, and the other arithmetic units are implemented by, for example, a logic circuit.

Next, details of the function of the error position calculation unit 103 will be described. In the present embodiment, the error position calculation unit 103 calculates an error position by the Chien search. In the present embodiment, the error position calculation unit 103 substitutes check values in parallel into the error locator polynomial to search for error positions in parallel. The search processing is executed in parallel in order to, for example, reduce the latency of the entire decoding processing. Hereinafter, the Chien search for searching for error positions in parallel may be referred to as a parallel Chien search.

First, the parallel Chien search will be described. A configuration example of the error position calculation unit 103 will be described later. Hereinafter, an example of a parallel Chien search in which the maximum number of corrected bits t by the BCH code is 4 and the parallelism p is 2 will be described. The parallelism p means that calculation of p error positions is executed in parallel. In this example, two values obtained by substituting two check values $x_1$ and $x_2$ into the error locator polynomial as shown in the following Formula (4) are calculated in parallel.

$$\sigma(x_1) = \sigma_0 + \sigma_1 x_1 + \sigma_2 x_1^2 + \sigma_3 x_1^3 + \sigma_4 x_1^4 \tag{4}$$

$$\sigma(x_2) = \sigma_0 + \sigma_1 x_2 + \sigma_2 x_2^2 + \sigma_3 x_2^3 + \sigma_4 x_2^4$$

Formula (5) corresponds to a formula in which Formula (4) is expressed by a matrix. A matrix of two rows and four columns of a second term on the right side may be referred to as a Vandermonde matrix.

$$\begin{pmatrix} \sigma(x_1) \\ \sigma(x_2) \end{pmatrix} = \begin{pmatrix} \sigma_0 \\ \sigma_0 \end{pmatrix} + \begin{pmatrix} x_1 & x_1^2 & x_1^3 & x_1^4 \\ x_2 & x_2^2 & x_2^3 & x_2^4 \end{pmatrix} \begin{pmatrix} \sigma_1 \\ \sigma_2 \\ \sigma_3 \\ \sigma_4 \end{pmatrix} \tag{5}$$

Figure 3:
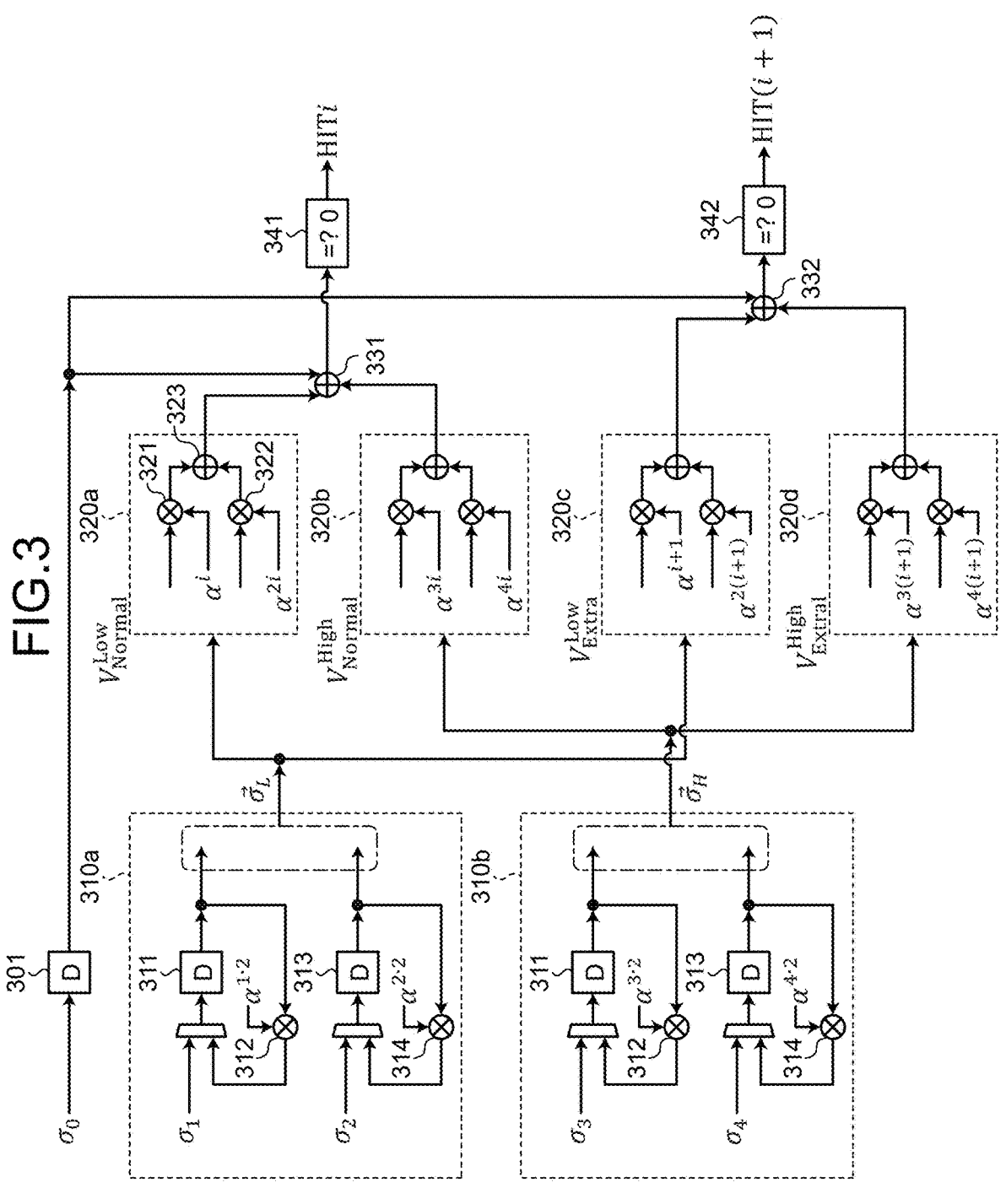
FIG. 3 is a block diagram illustrating an error position calculation unit of a first configuration example.

A first configuration example of the error position calculation unit that realizes the parallel Chien search will be described. FIG. 3 is a block diagram illustrating the error position calculation unit of the first configuration example. FIG. 3 illustrates a configuration of the parallel Chien search with the parallelism p=2.

The calculation with the parallelism of 2 corresponds to an example in which the check values $x_1$ and $x_2$ are calculated in parallel with $x_1 = \alpha^i$ and $x_2 = \sigma^{i+1}$, for example, similarly to Formulas (4) and (5). In this case, Formula (5) can be rewritten as the following Formula (6).

$$\begin{pmatrix} \sigma(x_1) \\ \sigma(x_2) \end{pmatrix} = \begin{pmatrix} \sigma_0 \\ \sigma_0 \end{pmatrix} + \begin{pmatrix} \alpha^i & \alpha^{2i} & \alpha^{3i} & \alpha^{4i} \\ \alpha^{i+1} & \alpha^{2(i+1)} & \alpha^{3(i+1)} & \alpha^{4(i+1)} \end{pmatrix} \begin{pmatrix} \sigma_1 \\ \sigma_2 \\ \sigma_3 \\ \sigma_4 \end{pmatrix} = \tag{6}$$

$$\begin{pmatrix} \sigma_0 \\ \sigma_0 \end{pmatrix} \begin{pmatrix} V_{Normal}^{Low} & V_{Normal}^{High} \\ V_{Extra}^{Low} & V_{Extra}^{High} \end{pmatrix} \begin{pmatrix} \vec{\sigma}_L \\ \vec{\sigma}_H \end{pmatrix}$$

$\sigma_L$ is a vector including low-order (Low) coefficients $\sigma_1$ and $\sigma_2$ as elements. $\sigma_H$ is a vector including high-order (High) coefficients $\sigma_3$ and $\sigma_4$ as elements. The Vandermonde matrix in the first row of Formula (6) can be expressed by the following matrices $V^{Low}_{Normal}$, $V^{High}_{Normal}$, $V^{Low}_{Extra}$, and $V^{High}_{Extra}$, which are matrices of one row and two columns, respectively.

$$V_{Normal}^{Low} = \begin{pmatrix} \alpha^i & \alpha^{2i} \end{pmatrix}$$

$$V_{Normal}^{High} = \begin{pmatrix} \alpha^{3i} & \alpha^{4i} \end{pmatrix}$$

$$V_{Extra}^{Low} = \begin{pmatrix} \alpha^{i+1} & \alpha^{2(i+1)} \end{pmatrix}$$

$$V_{Extra}^{High} = \begin{pmatrix} \alpha^{3(i+1)} & \alpha^{4(i+1)} \end{pmatrix}$$

Normal corresponds to the first half calculation of the two calculations to be parallelized, and Extra corresponds to the second half calculation of the two calculations to be parallelized. Also, Normal can correspond to the check value ($x_1 = \sigma^i$) having a small index among the check values (for example, $x_1 = \sigma^i$, $x_2 = \sigma^{i+1}$) substituted in parallel, and Extra can correspond to the check value ($x_2 = \sigma^{i+1}$) having a large index.

As illustrated in FIG. 3, the error position calculation unit of the first configuration example includes a register 301, circuits 310a and 310b, circuits 320a to 320d, adders 331 and 332, and arithmetic units 341 and 342.

The register 301 (third register) is a register that stores the coefficient $\sigma_0$ (third coefficient) of the error locator polynomial. The circuit 310a corresponds to a circuit that outputs a vector $\sigma_L$ including a low-order coefficient (first coefficient). A polynomial having the vector $\sigma_L$ as a coefficient may be referred to as a low-order polynomial $\sigma_L$ (x) (first polynomial). The circuit 310b corresponds to a circuit that outputs a vector $\sigma_H$ including a high-order coefficient (second coefficient). A polynomial having the vector $\sigma_H$ as a coefficient may be referred to as a high-order polynomial $\sigma_H$ (x).

Note that the low-order coefficients refer to first-order to s-th-order coefficients, and the high-order coefficients refer to (s+1)-th-order to t-th-order coefficients. s is, for example, a minimum integer of t/2 or more (s=ceiling (t/2)) or a maximum integer of t/2 or less (s=floor (t/2)). Hereinafter, an example of a case where t is an even number, namely, a case of s=t/2 will be mainly described.

The low-order polynomial $\sigma_L$ (x) and the high-order polynomial $\sigma_H$ (x) have a relation with the error locator polynomial $\sigma(x)$ shown in the following Formula (7).

$$\sigma(x) = \sigma_0 + \sigma_1 x + \sigma_2 x^2 + x^2 \left( \sigma_3 x + \sigma_4 x^2 \right) = \sigma_0 + \sigma_L(x) + x^2 \sigma_H(x) \tag{7}$$

The circuit 310a includes registers 311 and 313 (first registers) and multipliers 312 and 314.

The registers 311 and 313 are registers that respectively store two elements of the m-bit Galois field based on two low-order coefficients. The multiplier 312 multiplies a value stored in the register 311 by a fixed value ($\alpha^{1 \cdot p} = \alpha^{1 \cdot 2}$) to output a low-order coefficient to be used in the next cycle. The multiplier 314 multiplies a value stored in the register 313 by a fixed value ($\alpha^{2 \cdot p} = \alpha^{2 \cdot 2}$) to output a low-order coefficient to be used in the next cycle. Note that two selectors in the circuit 310a select the coefficient $\sigma_1$ or $\sigma_2$ in the first cycle (cycle 0), and select the output of the multiplier 312 or the multiplier 314 in the subsequent cycles (cycle 1 and subsequent cycles).

The circuit 310b is different from the circuit 310a only in coefficients ($\sigma_3$, $\sigma_4$) to be input and fixed values ($\alpha^{3 \cdot p} = \alpha^{3 \cdot 2}$, $\alpha^{4 \cdot p} = \alpha^{4 \cdot 2}$) to be multiplied. The circuit 310b has a configuration similar to that of the circuit 310a, so that the description thereof is omitted. The registers 311 and 313 of the circuit 310b correspond to a register (second register) that stores a high-order coefficient.

The circuits 320a, 320b, 320c, and 320d are circuits that execute arithmetic operations corresponding to the matrices $V^{Low}_{Normal}$, $V^{High}_{Normal}$, $V^{Low}_{Extra}$, and $V^{High}_{Extra}$, respectively. The circuit 320a includes multipliers 321 and 322 and an adder 323.

The multiplier 321 outputs a result obtained by multiplying the value $\alpha^i$, which is the first element of the matrix $V^{Low}_{Normal}$, by the first element of the input coefficient $\sigma_L$ to the adder 323. The multiplier 322 outputs a result obtained by multiplying the value $\alpha^{2i}$, which is the second element of the matrix $V^{Low}_{Normal}$, by the second element of the input coefficient $\sigma_L$ to the adder 323. The adder 323 outputs a result obtained by adding the two input values to the adder 331.

Although the circuits 320b, 320c, and 320d are mutually different in input coefficients or different multiplied values, these circuits have configurations similar to that of the circuit 320a. Therefore, the description of the configurations of these circuits is omitted.

The adder 331 outputs a result obtained by adding the value of the register 301, the output of the circuit 320a, and the output of the circuit 320b to the arithmetic unit 341. The adder 332 outputs a result obtained by adding the value of the register 301, the output of the circuit 320c, and the output of the circuit 320d to the arithmetic unit 342.

The arithmetic unit 341 outputs 1 of a bit as the output HITi in a case where the output of the adder 331 is 0 of the Galois field, and outputs 0 of a bit as HITi in a case where the output is a value other than 0 of the Galois field. The arithmetic unit 342 outputs 1 of a bit as HIT(i+1) in a case where the output of the adder 332 is 0 of the Galois field, and outputs 0 of a bit as HIT(i+1) in a case where the output is a value other than 0 of the Galois field.

FIG. 4 is a diagram for explaining an example of outputs of the arithmetic units 341 and 342. As illustrated in FIG. 4, in processing of a cycle 1, a value of HITi becomes a value of 1 indicating a root in a case where $x_1=\alpha^i$ is the root of the error locator polynomial ($\sigma(\alpha^i)=0$), and becomes a value of 0 indicating no root in a case where $x_1=\alpha^i$ is not the root of the error locator polynomial ($\sigma(\alpha^i)\neq0$). In addition, a value of HIT(i+1) becomes a value of 1 indicating a root in a case where $x_1=\alpha^{i+1}$ is the root of the error locator polynomial ($\sigma(\alpha^{i+1})=0$), and becomes a value of 0 indicating no root in a case where $x_1=\alpha^{i+1}$ is not the root of the error locator polynomial ($\sigma(\alpha^{i+1})\neq0$).

In processing of a cycle 2, the value of HITi becomes a value of 1 indicating a root in a case where $x_1=\alpha^{i+2}$ is the root of the error locator polynomial ($\sigma(\alpha^{i+2})=0$), and becomes a value of 0 indicating no root in a case where $x_1=\alpha^{i+2}$ is not the root of the error locator polynomial ($\sigma(\alpha^{i+2})\neq0$). In addition, the value of HIT(i+1) becomes a value of 1 indicating a root in a case where $x_1=\alpha^{i+3}$ is the root of the error locator polynomial ($\sigma(\alpha^{i+3})=0$), and becomes a value of 0 indicating no root in a case where $x_1=\alpha^{i+3}$ is not the root of the error locator polynomial ($\sigma(\alpha^{i+3})\neq0$).

Such processing of plural cycles is repeated using an element of the Galois field to be a next check value.

The configuration of the error position calculation unit that realizes the parallel Chien search is not limited to the configuration of FIG. 3. The configuration of FIG. 3 can be expressed by omitting description of the inside of each unit as in FIG. 5. FIG. 5 is a block diagram illustrating the error position calculation unit of the first configuration example. For example, in FIG. 5, description of configurations corresponding to the register 301, the circuits 310a and 310b, and the arithmetic units 341 and 342 in FIG. 3 is omitted, but the error position calculation unit may further include these configurations. The same applies to the error position calculation units illustrated in the following drawings.

The output of the adder 331 can be interpreted as an output for p/2 check values corresponding to Normal among p check values substituted in parallel. The output of the adder 332 can be interpreted as an output for p/2 check values corresponding to Extra among the p check values substituted in parallel. Therefore, in FIG. 5, the outputs of the adder 331 and the adder 332 are represented as $\sigma(x_{1:p/2})$ and $\sigma(x_{p/2+1:p})$, respectively.

The output $\sigma(x_{1:p/2})$ of the adder 331 means including p/2 outputs of the evaluation of the error locator polynomial when p/2 check values from $x_1$ to $x_{p/2}$ are substituted. The output $\sigma(x_{p/2+1:p})$ of the adder 332 means including p/2 outputs of the evaluation of the error locator polynomial when p/2 check values from $x_{p/2+1}$ to $x_p$ are substituted.

The output $\sigma(x_{1:p/2})$ corresponds to a vector including p/2 elements of $\sigma(x_1)$ to $\sigma(x_{p/2})$. Each element $\sigma(x_i)$ ($1\leq i\leq p/2$) can be interpreted as corresponding to error position information LA (first error position information) indicating whether i is an error position. Similarly, the output $\sigma(x_{p/2+1:p})$ corresponds to a vector including p/2 elements of $\sigma(x_{p/2+1})$ to $\sigma(x_p)$. Each element $\sigma(x_i)$ ($p/2+1\leq i\leq p$) can be interpreted as corresponding to error position information LB (second error position information) indicating whether i is an error position. Note that HITi and HIT(i+1) which are outputs of the arithmetic units 341 and 342 can also be interpreted as corresponding to error position information indicating whether i and i+1 are error positions.

Here, the expression form of the error locator polynomial will be further described. The t-th-order error locator polynomial $\sigma(x)$ is expressed by the above Formula (1). The evaluation of the polynomial by substituting $x_i$ into x can be expressed in the form of the inner product of vectors as in the following Formula (8).

$$\sigma(x_i) = \sigma_0 + \sigma_1 x_i^1 + \sigma_2 x_i^2 + \ldots + \sigma_t x_i^t = \tag{8}$$

$$\sigma_0 + \left(x_i^1, x_i^2, \ldots, x_i^t\right)\begin{pmatrix}\sigma_1\\\sigma_2\\\vdots\\\sigma_t\end{pmatrix} = \sigma_0 + \vec{x}_i^{1:t}\cdot\vec{\sigma}_{1:t}$$

In the parallel Chien search in which the parallelism is p, p check values ($x_1, x_2, \ldots, x_p$) are substituted into the error locator polynomial in parallel. When the p check values are expressed as a vector $x_{1:p}$, the calculation of substituting the p check values into the error locator polynomial in parallel can be expressed in the form of a matrix operation as in the following Formula (9). A vector $x_i^{1:t}$ ($1\leq i\leq p$) means ($x_i^1, x_i^2, \ldots, x_i^t$). A matrix $V_{1:p}^{1:t}$ means a Vandermonde matrix of p rows and t columns.

$$\sigma(\vec{x}_{1:p}) = \begin{pmatrix}\sigma(x_1)\\\sigma(x_2)\\\vdots\\\sigma(x_p)\end{pmatrix} = \tag{9}$$

$$\begin{pmatrix}\sigma_0\\\sigma_0\\\vdots\\\sigma_0\end{pmatrix} + \begin{pmatrix}x_1 & x_1^2 & \ldots & x_1^t\\x_2 & x_2^2 & \ldots & x_2^t\\\vdots & \vdots & \ddots & \vdots\\x_p & x_p^2 & \ldots & x_p^t\end{pmatrix}\begin{pmatrix}\sigma_1\\\sigma_2\\\vdots\\\sigma_t\end{pmatrix} = \vec{\sigma}_0 + \begin{pmatrix}\vec{x}_1^{1:t}\\\vec{x}_2^{1:t}\\\vdots\\\vec{x}_p^{1:t}\end{pmatrix}\vec{\sigma}_{1:t} = \vec{\sigma}_0 + V_{1:p}^{1:t}\vec{\sigma}_{1:t}$$

FIG. 5 can be interpreted as a configuration example of an error position calculation unit that realizes the parallel Chien search with the parallelism p. The calculation of the t-th-order error locator polynomial by the parallel Chien search with the parallelism p as illustrated in FIG. 5 is expressed by the following Formula (10).

$$\begin{pmatrix}\sigma(\vec{x}_{1:p/2})\\\sigma(\vec{x}_{p/2+1:p})\end{pmatrix} = \tag{10}$$

-continued $$\begin{pmatrix} \vec{\sigma}_0 \\ \vec{\sigma}_0 \end{pmatrix} + \begin{pmatrix} V^{1:t/2}_{1:p/2} & V^{t/2+1:t}_{1:p/2} \\ V^{1:t/2}_{p/2+1:p} & V^{t/2+1:t}_{p/2+1:p} \end{pmatrix} = \begin{pmatrix} \vec{\sigma}_0 \\ \vec{\sigma}_0 \end{pmatrix} + \begin{pmatrix} V^{Low}_{Normal} & V^{High}_{Normal} \\ V^{Low}_{Extra} & V^{High}_{Extra} \end{pmatrix} \begin{pmatrix} \vec{\sigma}_L \\ \vec{\sigma}_H \end{pmatrix}$$

Figure 6:
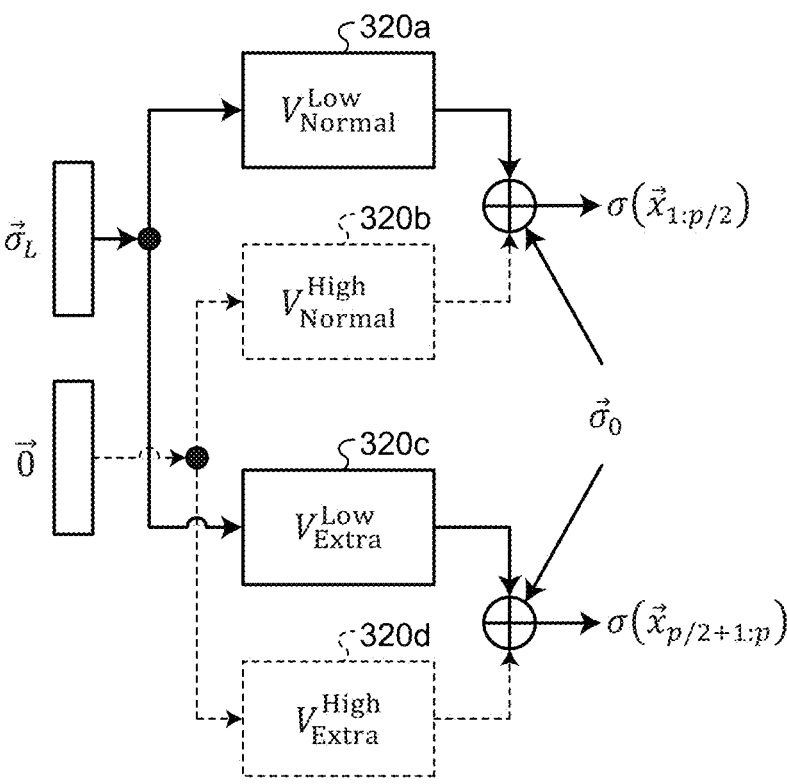
FIG. 6 is a diagram illustrating an example of calculation in a case where the number of errors is small.
Figure 7:
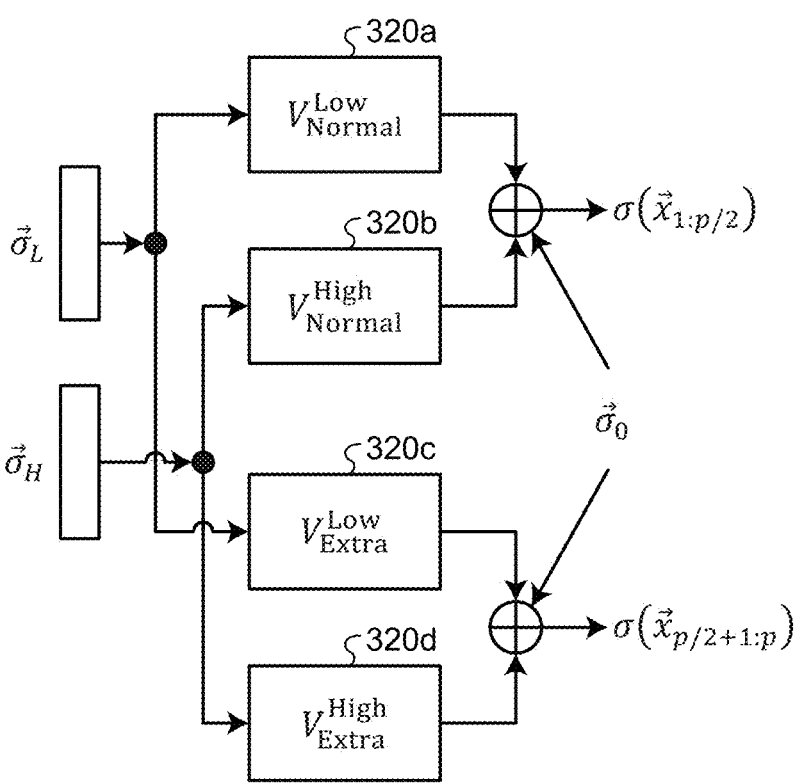
FIG. 7 is a diagram illustrating an example of calculation in a case where the number of errors is large.

An example of calculation according to the first configuration example of FIG. 5 will be described with reference to FIGS. 6 and 7. FIG. 6 is a diagram illustrating an example of calculation in a case where the number of errors is small. FIG. 7 is a diagram illustrating an example of calculation in a case where the number of errors is large. The case where the number of errors is small is, for example, a case where the number of errors is $t/2$ or less. The case where the number of errors is large is, for example, a case where the number of errors is larger than $t/2$.

When the number of errors is small (FIG. 6), the high-order coefficient among the coefficients of the t-th-order error locator polynomial is 0. In other words, $\sigma_H$ is a vector (hereinafter, a zero vector) in which all elements are 0. Therefore, among the units of the error position calculation unit of the first configuration example, the circuits 320a (corresponding to $V^{Low}_{Normal}$) and 320c (corresponding to $V^{Low}_{Extra}$) that perform the calculation using $\sigma_L$ operate (are activated), but the circuits 320b (corresponding to $V^{High}_{Normal}$) and 320d (corresponding to $V^{High}_{Extra}$) that perform the calculation using $\sigma_H$ do not operate. Therefore, in the case of FIG. 6, the power consumption can be suppressed. A broken line in FIG. 6 indicates that the circuit does not operate.

On the other hand, in a case where the number of errors is large (FIG. 7), at least a part of high-order coefficients of the t-th-order error locator polynomial has a value other than 0. Therefore, all of the circuits 320a to 320d included in the error position calculation unit of the first configuration example operate (are activated). As a result, there is a possibility that an increase in power consumption cannot be suppressed.

In FIGS. 6 and 7, an example of a calculation formula corresponding to the operation of the circuit is illustrated above the circuit.

In the parallel Chien search, the power consumption of the circuit may increase as the number of errors increases. In order to suppress an increase in power consumption, it is conceivable to halve the parallelism when the number of errors increases. Hereinafter, such a configuration may be referred to as two-division parallel Chien search. In the present embodiment, since the calculation of the parallelism p is divided into two, p is an even integer satisfying $2 \leq p < n$. n is an integer of 2 or more representing a code length (the number of bits) of an error correction code.

Figure 8:
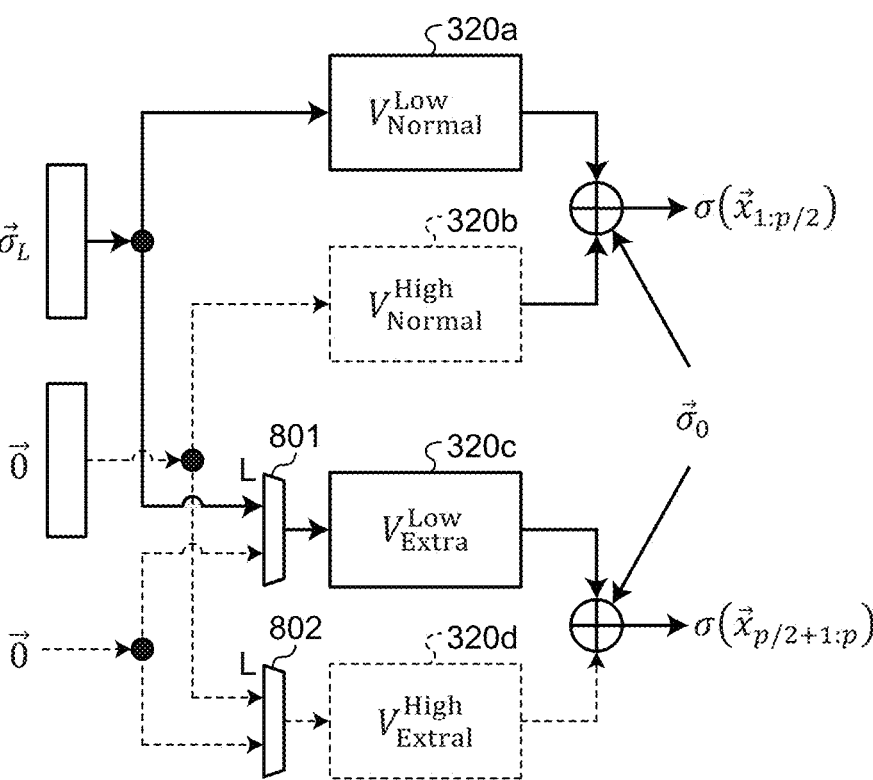
FIG. 8 is a diagram for explaining the operation of an error position calculation unit of a second configuration example.
Figure 9:
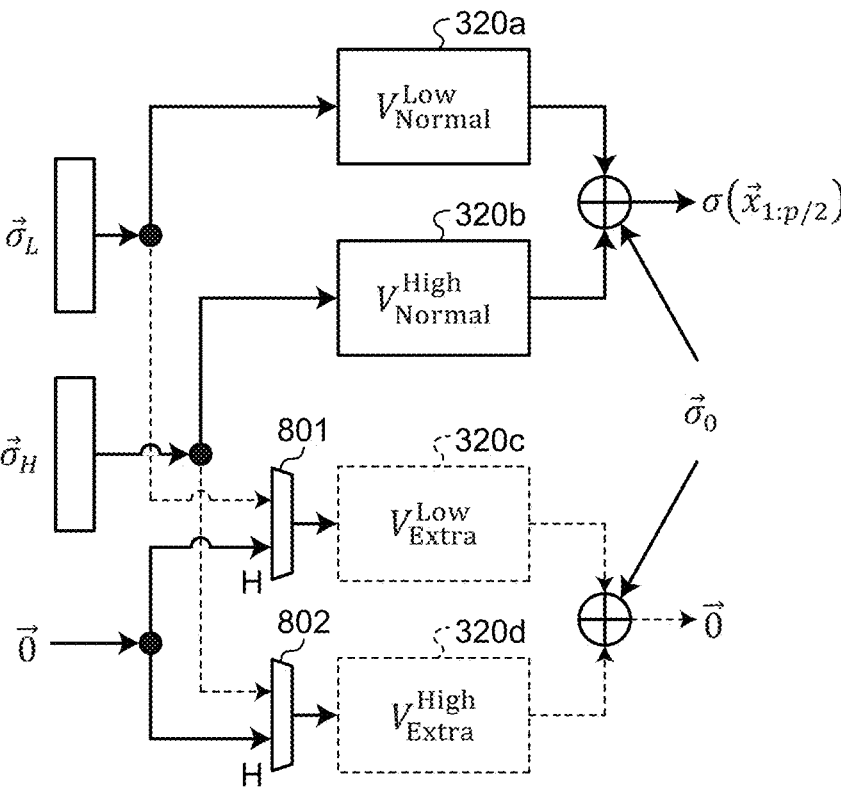
FIG. 9 is a diagram for explaining the operation of the error position calculation unit of the second configuration example.

Hereinafter, a second configuration example of two-division parallel Chien search capable of suppressing power consumption even when the number of errors is large will be described. FIGS. 8 and 9 are diagrams for explaining the operation of an error position calculation unit of the second configuration example that realizes the two-division parallel Chien search. In the second configuration example, selectors 801 and 802 for switching a circuit to be operated are added.

In a case where the number of errors is small (for example, the number of errors is $t/2$ or less), the selector 801 selects a vector $\sigma_L$ including a low-order coefficient (FIG. 8), and in a case where the number of errors is large (for example, the number of errors is larger than $t/2$), the selector 801 selects a zero vector (FIG. 9).

In a case where the number of errors is small, the selector 802 selects a vector 6H including a high-order coefficient (FIG. 8). In a case where the number of errors is large, the selector 802 selects a zero vector (FIG. 9). In a case where the number of errors is small, since the vector 6H is a vector in which all elements are 0, in FIG. 8, a zero vector is described instead of the vector 6H.

As illustrated in FIG. 9, in a case where the number of errors is large, the circuit 320c and the circuit 320d can be configured not to operate. As a result, as compared with the first configuration example in FIG. 5 (FIG. 7), an increase in power consumption can be suppressed.

As can be seen from the description of FIGS. 8 and 9, in the second configuration example, the circuit 320d does not operate in both the case where the number of errors is small and the case where the number of errors is large. Therefore, the unnecessary circuit 320d is provided, and the circuit size may not be suppressed.

A third configuration example capable of suppressing the circuit size will be described. FIGS. 10 and 11 are diagrams for explaining the operation of an error position calculation unit of the third configuration example. The third configuration example is different from the second configuration example in that the selector 802 and the circuit 320d are removed.

The selector 801 selects the vector $\sigma_L$ including the low-order coefficient when the number of errors is small (FIG. 10), and selects the zero vector when the number of errors is large (FIG. 11).

In the third configuration example, since the unnecessary circuit 320d and selector 802 are not provided, an increase in circuit size can be suppressed as compared with the second configuration example.

As described above, the size of the arithmetic circuit for the processing of searching for the root of the error locator polynomial such as the Chien search tends to be increased in the circuit that realizes the decoding processing. Therefore, in the present embodiment, a configuration capable of further suppressing the circuit size while suppressing the power consumption is achieved.

Figure 12:
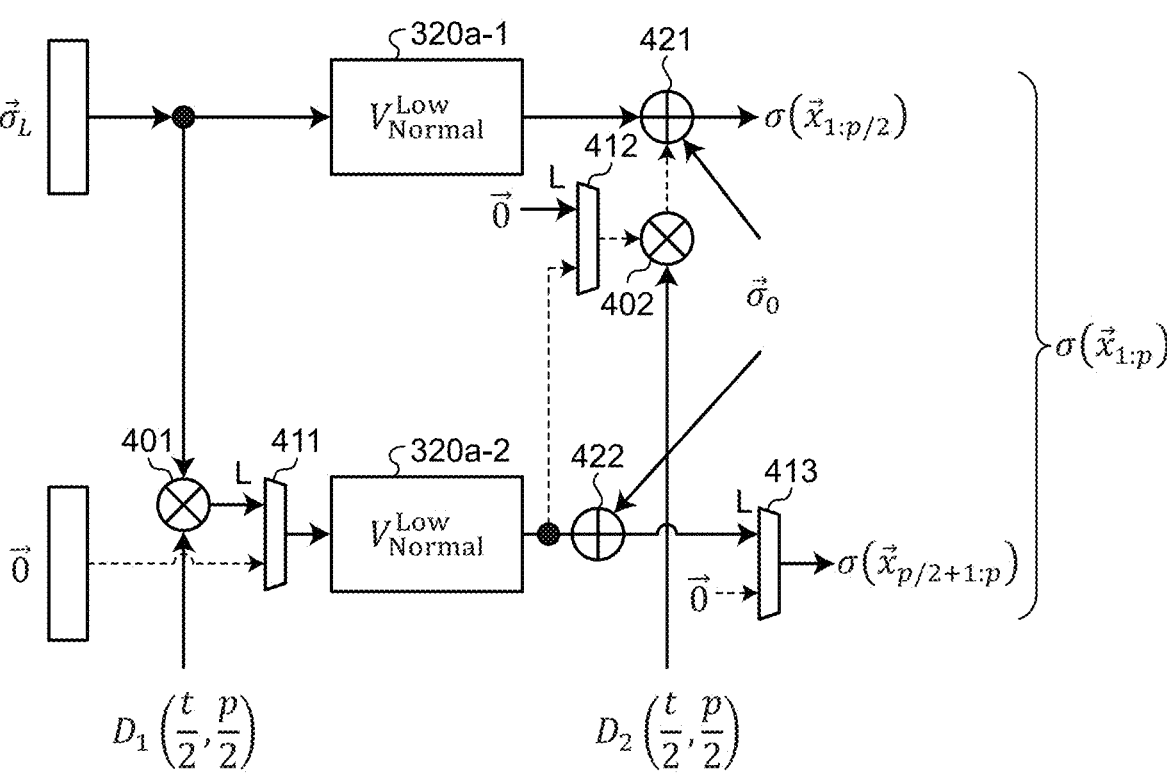
FIG. 12 is a block diagram illustrating a configuration example of an error position calculation unit according to the embodiment.

FIG. 12 is a block diagram illustrating a configuration example of the error position calculation unit 103 of the embodiment. As illustrated in FIG. 12, the error position calculation unit 103 includes two circuits 320a-1 and 320a-2, multipliers 401 and 402, selectors 411, 412, and 413, and adders 421 and 422.

Figure 13:
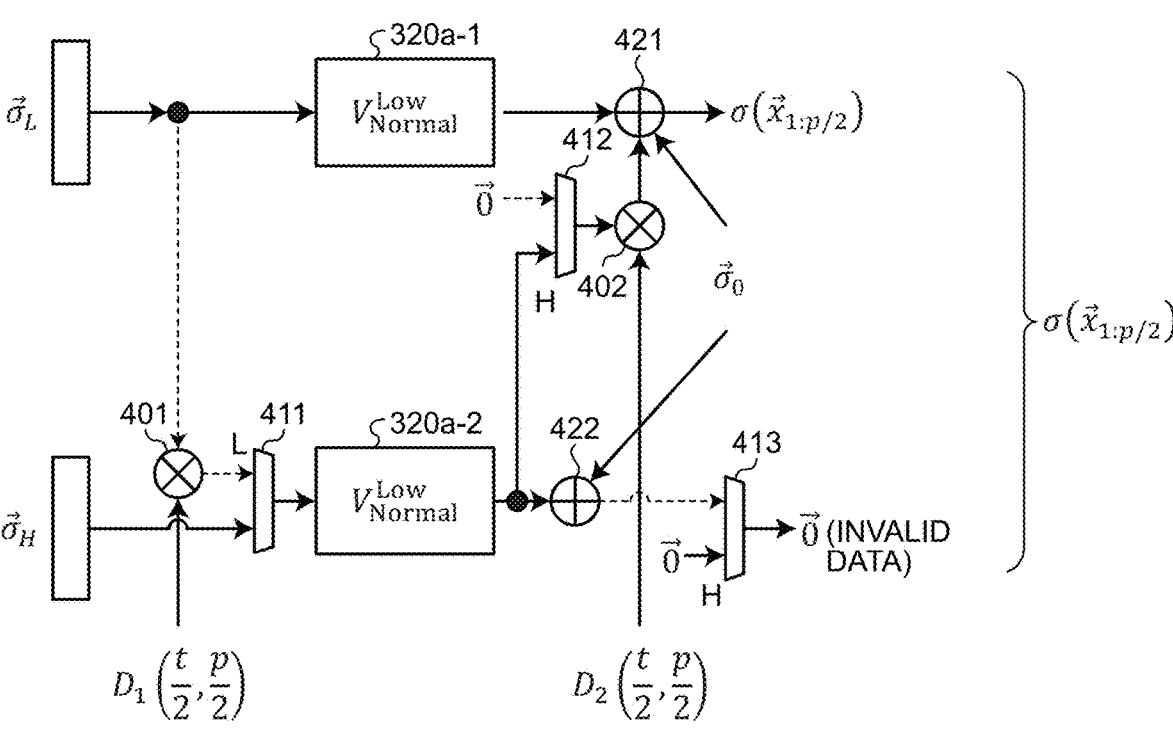
FIG. 13 is a diagram illustrating an example of calculation by the error position calculation unit in a case where the number of errors is large.

Note that FIG. 12 also illustrates an example of calculation by the error position calculation unit 103 in a case where the number of errors is small. FIG. 13 is a diagram illustrating an example of calculation by the error position calculation unit 103 in a case where the number of errors is large. Hereinafter, the operation of the error position calculation unit 103 will be described with reference to FIGS. 12 and 13.

The circuits 320a-1 and 320a-2 are circuits that execute the arithmetic operation corresponding to the matrix $V^{Low}_{Normal}$, similarly to the circuit 320a in FIG. 3. Thus, the circuit 320a-1 and the circuit 320a-2 are mutually different in input values, whereas these circuits execute the similar arithmetic operation.

The circuit 320a-1 (first circuit) corresponds to a substitution circuit (first substitution circuit) that calculates p/2 evaluation values EA (first evaluation values) by substituting p/2 check values into a t/2-th-order input polynomial PA (first input polynomial). The p/2 evaluation values EA are used for calculating p/2 pieces of error position information LA indicating whether the position is an error position. The input polynomial PA corresponds to a low-order polynomial that is a polynomial obtained from the error locator polynomial.

The circuit 320a-2 (second circuit) corresponds to a substitution circuit (second substitution circuit) that calculates p/2 evaluation values EB (second evaluation values) by substituting p/2 check values into a t/2-th-order input polynomial. The p/2 evaluation values EB are used for calculating p/2 pieces of error position information LB indicating whether the position is an error position.

The t/2-th-order input polynomial (second polynomial) used by the circuit 320a-2 is an input polynomial PB (second input polynomial) represented by a coefficient obtained by converting a coefficient of the low-order polynomial in a case where the number of errors is small, and is the same input polynomial PC (third input polynomial) as the high-order polynomial in a case where the number of errors is large.

In a case where, for example, the number of errors is t/2 or less, the error position calculation unit 103 obtains coefficients of the input polynomial PB by performing coefficient conversion of the low-order polynomial. Then, in the circuit 320a-1, the evaluation values EA obtained by substituting p/2 check values $x_{1:p/2}$ (first check values) from the first to the p/2-th among the p check values $x_{1:p}$ from $x_1$ to $x_p$ into the input polynomial PA (low-order polynomial) are calculated. On the other hand, in the circuit 320a-2, the evaluation values EB obtained by substituting p/2 check values $x_{1:p/2}$ from the first to the p/2-th into the input polynomial PB are calculated. The evaluation values EB are the same as evaluation values obtained by substituting p/2 check values $x_{p/2+1:p}$ (second check values) from the (p/2+1)-th to the p-th into the input polynomial PA. The output $\sigma(x_{1:p/2})$ corresponds to the error position information LA obtained by adding $\sigma_0$ to each of the p/2 evaluation values EA calculated by the circuit 320a-1. The output $\sigma(x_{p/2+1:p})$ corresponds to the error position information LB obtained by adding $\sigma_0$ to each of the p/2 evaluation values EB calculated by the circuit 320a-2. The output $\sigma(x_{1:p})$ including the output $\sigma(x_{1:p/2})$ and the output $\sigma(x_{p/2+1:p})$ corresponds to the p pieces of error position information output by the error position calculation unit 103.

When the number of errors is larger than t/2, the error position calculation unit 103 converts p/2 evaluation values EB calculated by the circuit 320a-2 by substituting p/2 check values $x_{1:p/2}$ into the high-order polynomial (input polynomial PC) into p/2 evaluation values EC (third evaluation values) using a predetermined diagonal matrix $D_2$ (details will be described later). The error position calculation unit 103 adds the p/2 evaluation values EA calculated by the circuit 320a-1 by substituting p/2 check values $x_{1:p/2}$ into the low-order polynomial (input polynomial PA) and the p/2 evaluation values EC to calculate p/2 evaluation values ED (fourth evaluation values). The error position calculation unit 103 outputs p/2 pieces of error position information LA calculated by adding $\sigma_0$ to each of the p/2 evaluation values ED.

The multiplier 401 (first multiplier) multiplies a vector $\sigma_L$ including low-order coefficients by a predetermined diagonal matrix $D_1(t/2, p/2)$, and outputs a multiplication result to the selector 411. The multiplication by the multiplier 401 corresponds to processing of obtaining coefficients (fourth coefficients) of the input polynomial PB by converting coefficients of the low-order polynomial (input polynomial PA). In one example, the multiplication by the multiplier 401 corresponds to obtaining the coefficient of the input polynomial PB by multiplying the k-th-order (k is an integer satisfying 1≤k≤t/2) coefficient of the low-order polynomial by $\alpha^{kp/2}$.

In a case where the number of errors is small, the selector 411 (first selector) selects a multiplication result by the multiplier 401 and outputs the multiplication result to the circuit 320a-2 (FIG. 12). In a case where the number of errors is large, the selector 411 selects a vector $\sigma_H$ including a high-order coefficient and outputs the vector to the circuit 320a-2 (FIG. 13). The selector 411 corresponds to a configuration that outputs coefficients (fifth coefficients) of a t/2-th-order input polynomial used by the circuit 320a-2.

As illustrated in FIG. 12, in a case where the number of errors is small, the two circuits 320a-1 and 320a-2 and the arithmetic operation (multiplier 401) using the diagonal matrix $D_1(t/2, p/2)$ are activated.

Multiplying the vector $\sigma_L$ by the predetermined diagonal matrix $D_1(t/2, p/2)$ corresponds to using a matrix obtained by multiplying the matrix $V^{Low}_{Normal}$ by the diagonal matrix $D_1(t/2, p/2)$ for multiplication with the vector $\sigma_L$, as described in the formula at the top of FIG. 12. Details of the diagonal matrix $D_1(t/2, p/2)$ and the reason for using the diagonal matrix $D_1(t/2, p/2)$ will be described later.

When the number of errors is small, the selector 412 (second selector) selects the zero vector (first value) and outputs the zero vector to the multiplier 402 (FIG. 12). The zero vector is a vector in which all of p/2 elements are 0. In a case where the number of errors is large, the selector 412 selects the output of the circuit 320a-2 and outputs the selected output to the multiplier 402 (FIG. 13).

The multiplier 402 (second multiplier) multiplies the output (second value) of the selector 412 by a predetermined diagonal matrix $D_2(t/2, p/2)$, and outputs a multiplication result to the adder 421. In a case where the number of errors is small, since the selector 412 outputs a zero vector, the multiplication result of the multiplier 402 is 0. Therefore, the output of the multiplier 402 does not affect the result by the adder 421. When the number of errors is large, since the selector 412 selects and outputs the output of the circuit 320a-2, the multiplier 402 outputs a multiplication result of the output of the circuit 320a-2 and the diagonal matrix $D_2(t/2, p/2)$.

The multiplication by the multiplier 402 corresponds to processing of converting the evaluation values EB calculated by the circuit 320a-2 into the evaluation values EC using the diagonal matrix $D_2$. The multiplication by the multiplier 402 corresponds to, for example, obtaining the evaluation values EC by multiplying the p/2 evaluation values EB calculated by the circuit 320a-2 by predetermined p/2 multiplication values (diagonal components of the diagonal matrix $D_2$).

As illustrated in FIG. 13, in a case where the number of errors is large, the two circuits 320a-1 and 320a-2 and the arithmetic operation (multiplier 402) using the diagonal matrix $D_2(t/2, p/2)$ are activated.

Outputting the multiplication result of the output of the circuit 320a-2 and the diagonal matrix $D_2(t/2, p/2)$ corresponds to using a matrix obtained by multiplying the diagonal matrix $D_2(t/2, p/2)$ and the matrix $V^{Low}_{Normal}$ for multiplication with the vector $\sigma_H$, as described in the formula at the top of FIG. 13. Details of the diagonal matrix $D_2(t/2, p/2)$ and the reason for using the diagonal matrix $D_2(t/2, p/2)$ will be described later.

The adder 421 (first adder) adds the output of the circuit 320a-1, the output of the multiplier 402, and the vector $\sigma_0$ corresponding to the 0-th-order coefficient, and outputs an addition result as an output $\sigma(x_{1:p/2})$ (first error position information).

The adder 422 (second adder) adds the output of the circuit 320a-2 and the vector $\sigma_0$ corresponding to the 0-thorder coefficient, and outputs an addition result as an output $\sigma(x_{p/2+1:p})$ (second error position information).

The selector 413 (third selector) selects and outputs the output $\sigma(x_{p/2+1:p})$ of the adder 422 in a case where the number of errors is small, and selects and outputs invalid data that is not error position information in a case where the number of errors is large. The invalid data is, for example, a vector including p/2 elements, and is a zero vector in which all of the p/2 elements are 0.

In a case where the number of errors is small, the output of the error position calculation unit 103 is an output $\sigma(x_{1:p})$ including the output $\sigma(x_{1:p/2})$ of the adder 421 and the output $\sigma(x_{p/2+1:p})$ of the adder 422 (selector 413). The output $\sigma(x_{1:p})$ corresponds to p pieces of error position information. In a case where the number of errors is large, the output of the error position calculation unit 103 is the output $\sigma(x_{1:p/2})$ of the adder 421. Thus, the output of the adder 422 is not included in the output of the error position calculation unit 103. The output $\sigma(x_{1:p/2})$ corresponds to p/2 pieces of error position information.

Next, the diagonal matrix $D_1(t/2, p/2)$ will be described in detail.

When $\alpha^i$ is substituted into $x_i$, the evaluation of the error locator polynomial in the form of the inner product of the vectors as in the above Formula (8) can be expressed as the following Formula (11).

$$\sigma(\alpha^i) = \sigma_0 + (\alpha^i, \alpha^{2i}, \dots, \alpha^{ti}) \cdot \vec{\sigma}_{1:t} \tag{11}$$

When $\alpha^{i+q}$ obtained by multiplying $\alpha^i$ by $\alpha^q$ is substituted into $x_i$, the evaluation of the error locator polynomial can be expressed as the following Formula (12). Formula (12) can be interpreted as corresponding to the error locator polynomial obtained by shifting the error locator polynomial of Formula (11) by a diagonal matrix $D_1(t, q)$ defined by the following Formula (13). Hereinafter, such a shift may be referred to as a polynomial shift, and q may be referred to as a shift amount. As shown in Formula (12) and Formula (13), the diagonal matrix $D_1(t, q)$ is a matrix that does not depend on i.

$$\sigma(\alpha^{i+q}) = \sigma_0 + (\alpha^{i+q}, \alpha^{2(i+q)}, \dots, \alpha^{t(i+q)}) \cdot \vec{\sigma}_{1:t} = \tag{12}$$

$$\sigma_0 + (\alpha^i, \alpha^{2i}, \dots, \alpha^{ti}) \cdot \begin{pmatrix} \alpha^q & & & 0 \\ & \alpha^{2q} & & \\ & & \ddots & \\ 0 & & & \alpha^{tq} \end{pmatrix} \vec{\sigma}_{1:t}$$

$$D_1(t, q) := \mathrm{diag}(\alpha^q, \alpha^{2q}, \dots, \alpha^{tq}) \tag{13}$$

The inner product of the vector in the first row of Formula (12) can be rewritten in the form of the inner product using the same vector as the vector used for the calculation of the inner product of Formula (11) by using the diagonal matrix $D_1$.

The similar rewriting (polynomial shift) can also be applied to calculation using the Vandermonde matrix. In the present embodiment, rewriting using the diagonal matrix is applied to calculation of a matrix used in the two-division parallel Chien search.

An example in which rewriting using the diagonal matrix $D_1$ is applied to the two-division parallel Chien search will be described. Hereinafter, a case of t=4 and the parallelism p=4 will be described as an example.

The following Formula (14) shows an example of the Vandermonde matrix in this case. When an element in the k-th column in the first row of the Vandermonde matrix of Formula (14) is multiplied by $\alpha^{kp/2}=\alpha^{2k}$, an element in the third row is obtained. Similarly, when an element in the k-th column in the second row is multiplied by $\alpha^{kp/2}=\alpha^{2k}$, an element in the fourth row is obtained. Therefore, in order to rewrite the first row and the second row to the third row and the fourth row, the diagonal matrix $D_1$ similar to Formula (12) can be applied. Note that, in the example of Formula (14), since p/2 (=4/2) corresponds to the shift amount q, the diagonal matrix is represented as $D_1(4, 2)$.

$$\begin{pmatrix} \alpha^i & \alpha^{2i} & \alpha^{3i} & \alpha^{4i} \\ \alpha^{i+1} & \alpha^{2(i+1)} & \alpha^{3(i+1)} & \alpha^{4(i+1)} \\ \alpha^{i+2} & \alpha^{2(i+2)} & \alpha^{3(i+2)} & \alpha^{4(i+2)} \\ \alpha^{i+3} & \alpha^{2(i+3)} & \alpha^{3(i+3)} & \alpha^{4(i+3)} \end{pmatrix} = \tag{14}$$

$$\begin{pmatrix} \begin{pmatrix} \alpha^i & \alpha^{2i} & \alpha^{3i} & \alpha^{4i} \\ \alpha^{i+1} & \alpha^{2(i+1)} & \alpha^{3(i+1)} & \alpha^{4(i+1)} \end{pmatrix} \\ \begin{pmatrix} \alpha^i & \alpha^{2i} & \alpha^{3i} & \alpha^{4i} \\ \alpha^{i+1} & \alpha^{2(i+1)} & \alpha^{3(i+1)} & \alpha^{4(i+1)} \end{pmatrix} \begin{pmatrix} \alpha^2 & 0 & 0 & 0 \\ 0 & \alpha^4 & 0 & 0 \\ 0 & 0 & \alpha^6 & 0 \\ 0 & 0 & 0 & \alpha^8 \end{pmatrix} \end{pmatrix} =$$

$$\begin{pmatrix} V_{Normal} \\ V_{Normal} D_1(4,2) \end{pmatrix}$$

In Formula (14), a matrix including the first and second rows of the Vandermonde matrix is expressed as $V_{Normal}$. The matrix including the third and fourth rows of the Vandermonde matrix is rewritten to multiplication of the matrix $V_{Normal}$ and the diagonal matrix $D_1(t, p/2)=D_1(4, 2)$. Such rewriting corresponds to rewriting the matrix used in the second half calculation (Extra) of the two calculations to be parallelized to the multiplication of the matrix used in the first half calculation (Normal) and the diagonal matrix.

In a case where, for example, the check value shown in Formula (15) is used, the Vandermonde matrix of p rows and t columns including the matrix $V_{Normal}$ of p/2 rows and t columns and the matrix $V_{Extra}$ of p/2 rows and t columns can be rewritten in the form using the matrix $V_{Normal}$ and the diagonal matrix $D_1(t, p/2)$ as shown in Formula (16).

$$(x_1, x_2, \dots, x_p) = (\alpha^i, \alpha^{i+1}, \dots, \alpha^{i+(p-1)}) \tag{15}$$

$$\begin{pmatrix} V_{Normal} \\ V_{Extra} \end{pmatrix} = \begin{pmatrix} V_{Normal} \\ V_{Normal} D_1(t, p/2) \end{pmatrix} \tag{16}$$

In Formulas (14) and (16), the Vandermonde matrix is not divided into a low order (Low) and a high order (High) in the column direction for convenience of description. For the error position calculation unit 103 according to the embodiment illustrated in FIG. 12, rewriting as in Formula (14) may be applied to the matrix $V^{Low}_{Normal}$ and the matrix $V^{Low}_{Extra}$ which are the low-order portions of the Vandermonde matrix. That is, the matrix $V^{Low}_{Extra}$ is rewritten to the multiplication of the matrix $V^{Low}_{Normal}$ and the diagonal matrix $D_1(t/2, p/2)$. The formula at the top of FIG. 12 shows an example of a Vandermonde matrix including a matrix obtained by rewriting the matrix $V^{Low}_{Extra}$ to multiplication of the matrix $V^{Low}_{Normal}$ and the diagonal matrix $D_1(t/2, p/2)$.

Next, the diagonal matrix $D_2(t/2, p/2)$ will be described in detail.

The calculation of the inner product using the high-order coefficient included in the substitution calculation of the error locator polynomial can be rewritten to a calculation including an element used in the calculation of the inner product using the low-order coefficient by using the factorization. The following Formula (17) is a formula showing an example of rewriting of the evaluation of the error locator polynomial.

$$\sigma(x = \alpha^i) = \sigma_0 + (\sigma^i, \alpha^{2i}) \cdot \vec{\sigma}_{1:2} + (\alpha^{3i}, \alpha^{4i}) \cdot \vec{\sigma}_{3:4} = \quad (17)$$

$$\sigma_0 + (\alpha^i, \alpha^{2i}) \cdot \vec{\sigma}_{1:2} + \alpha^{2i}(\alpha^i, \alpha^{2i}) \cdot \vec{\sigma}_{3:4}$$

The first row of Formula (17) includes an inner product using a low-order coefficient $\sigma_{1:2}$ and an element $(\alpha^i, \alpha^{2i})$ and an inner product using a high-order coefficient $\sigma_{3:4}$ and an element $(\alpha^{3i}, \alpha^{4i})$. The latter inner product can be rewritten to include the element $(\alpha^i, \alpha^{2i})$ used in the calculation of the low-order inner product, as illustrated in the second row.

Similar rewriting can be applied to the Vandermonde matrix. The following Formula (18) is a formula showing an example of rewriting of the Vandermonde matrix.

$$\left( \begin{pmatrix} \alpha^i & \alpha^{2i} \\ \alpha^{i+1} & \alpha^{2(i+1)} \\ \alpha^{i+2} & \alpha^{2(i+2)} \\ \alpha^{i+3} & \alpha^{2(i+3)} \end{pmatrix} \middle| \begin{pmatrix} \alpha^{2i}(\alpha^i, \alpha^{2i}) \\ \alpha^{2(i+1)}(\alpha^{i+1}, \alpha^{2(i+1)}) \\ \alpha^{2(i+2)}(\alpha^{i+2}, \alpha^{2(i+2)}) \\ \alpha^{2(i+3)}(\alpha^{i+3}, \alpha^{2(i+3)}) \end{pmatrix} \right) = \quad (18)$$

$$\left( \begin{pmatrix} \alpha^i & \alpha^{2i} \\ \alpha^{i+1} & \alpha^{2(i+1)} \\ \alpha^{i+2} & \alpha^{2(i+2)} \\ \alpha^{i+3} & \alpha^{2(i+3)} \end{pmatrix} \begin{pmatrix} \alpha^{2i} & 0 & 0 & 0 \\ 0 & \alpha^{2(i+1)} & 0 & 0 \\ 0 & 0 & \alpha^{2(i+1)} & 0 \\ 0 & 0 & 0 & \alpha^{2(i+3)} \end{pmatrix} \begin{pmatrix} \alpha^i & \alpha^{2i} \\ \alpha^{i+1} & \alpha^{2(i+1)} \\ \alpha^{i+2} & \alpha^{2(i+2)} \\ \alpha^{i+3} & \alpha^{2(i+3)} \end{pmatrix} \right)$$

A matrix in the first row of Formula (18) corresponds to a matrix obtained by rewriting elements of high-order columns (third column and fourth column) of the Vandermonde matrix in the first row of Formula (14) to elements including elements of low-order columns (first column and second column) as factors. The two high-order columns are further rewritten in the form of multiplication of a diagonal matrix illustrated in the center of the second row and a matrix including the low-order columns. This diagonal matrix corresponds to the diagonal matrix $D_2$.

An example of rewriting the Vandermonde matrix $V_{1:p}^{1:t}$ shown in Formula (9) will be described. In this case, a matrix $V_{1:p}^{t/2+1:t}$ including the high-order columns in the Vandermonde matrix $V_{1:p}^{1:t}$ is rewritten to multiplication of a matrix $V_{1:p}^{1:t/2}$ including the low-order columns and the diagonal matrix $D_2(t/2, p)$. The following Formula (19) is a formula showing an example of such rewriting.

$$V_{1:p}^{t/2+1:t} = \begin{pmatrix} x_1^{t/2}(x_1, x_1^2, \ldots, x_1^{t/2}) \\ x_2^{t/2}(x_2, x_2^2, \ldots, x_2^{t/2}) \\ \vdots \\ x_p^{t/2}(x_p, x_p^2, \ldots, x_p^{t/2}) \end{pmatrix} = \quad (19)$$

-continued $$\begin{pmatrix} x_1^{t/2} & 0 & \ldots & 0 \\ 0 & x_2^{t/2} & \ldots & 0 \\ \vdots & \vdots & \ddots & \vdots \\ 0 & 0 & \ldots & x_p^{t/2} \end{pmatrix} \begin{pmatrix} x_1 & x_1^2 & \ldots & x_1^{t/2} \\ x_2 & x_2^2 & \ldots & x_2^{t/2} \\ \vdots & \vdots & \ddots & \vdots \\ x_p & x_p^2 & \ldots & x_p^{t/2} \end{pmatrix} = D_2(t/2, p) V_{1:p}^{1:t/2}$$

The diagonal matrix $D_2(t, p)$ is defined by the following Formula (20). As shown in Formula (20), the diagonal matrix $D_2(t, p)$ is a matrix that does not depend on i.

$$D_2(t, p) = \text{diag}(x_1^t, x_2^t, \ldots, x_p^t) \quad (20)$$

Note that Formula (20) corresponds to the definition of the diagonal matrix $D_2(t, p)$ in a general case where the Vandermonde matrix is not divided into two of a low order and a high order. In the two-division parallel Chien search, the t-th-order error locator polynomial is divided into two (t/2)-th-order polynomials. Therefore, the divided matrix $V_{1:p}^{t/2+1:t}$ is multiplied by the diagonal matrix $D_2(t/2, p)$.

In a case where the Vandermonde matrix is expressed by a matrix $V^{Low}$ including low-order columns and a matrix $V^{High}$ including high-order columns, the Vandermonde matrix $(V^{Low} V^{High})$ can be rewritten in a form using the diagonal matrix $D_2(t/2, p)$ and the matrix $V^{Low}$, as shown in the following Formula (21).

$$( V^{Low} \quad V^{High} ) = ( V^{Low} \quad D_2(t/2, p) V^{Low} ) \quad (21)$$

In Formula (21), the calculation of the parallelism p is not divided into two for convenience of explanation. For the error position calculation unit 103 according to the embodiment as illustrated in FIG. 12 (FIG. 13), rewriting as in Formula (21) may be applied to the matrix $V^{High}_{Normal}$, which is a portion corresponding to the divided first half of the Vandermonde matrix and a high-order portion, with the parallelism set to p/2. That is, the matrix $V^{High}_{Normal}$ is rewritten to multiplication of the diagonal matrix $D_2(t/2, p/2)$ and the matrix $V^{Low}_{Normal}$. The formula at the top of FIG. 13 shows an example of a Vandermonde matrix including a matrix obtained by rewriting the matrix $V^{High}_{Normal}$ to multiplication of the diagonal matrix $D_2(t/2, p/2)$ and the matrix $V^{Low}_{Normal}$.

As described above, the matrix $V^{Low}_{Extra}$ used when the number of errors is small can be rewritten to multiplication of the matrix $V^{Low}_{Normal}$ and the diagonal matrix $D_1(t/2, p/2)$. Therefore, the circuit 320c corresponding to the matrix $V^{Low}_{Extra}$ can be replaced with a circuit 320a-2 corresponding to the matrix $V^{Low}_{Normal}$ and a multiplier 401 that multiplies the diagonal matrix $D_1(t/2, p/2)$.

On the other hand, the matrix $V^{High}_{Normal}$ used when the number of errors is large can be rewritten to multiplication of the diagonal matrix $D_2(t/2, p/2)$ and the matrix $V^{Low}_{Normal}$. Therefore, the circuit 320b corresponding to the matrix $V^{High}_{Normal}$ can be replaced with the multiplier 402 that multiplies the diagonal matrix $D_2(t/2, p/2)$ and the circuit 320a-2 corresponding to the matrix $V^{Low}_{Normal}$.

As a whole, the two circuits 320b and 320c are replaced with one circuit 320a-2 and two multipliers 401 and 402. In the comparison in the matrix used for calculation, the two matrices $V^{Low}_{Extra}$ and $V^{High}_{Normal}$ are replaced with one matrix $V^{Low}_{Normal}$ and two diagonal matrices $D_1$ and $D_2$. Since the diagonal matrix is a matrix only including diagonal components, the diagonal matrix substantially corresponds to a vector including elements for one row or one column. Therefore, a circuit that executes the arithmetic operation using the diagonal matrix can be made smaller in circuit size than a circuit that executes the arithmetic operation of a matrix that is not the diagonal matrix.

Thus, the error position calculation unit 103 of the present embodiment can replace two circuits for calculating two matrices that are not the diagonal matrix with one circuit for calculating a matrix that is not the diagonal matrix and two circuits for calculating the diagonal matrix. As a result, it is possible to suppress the size of the arithmetic circuit used for the arithmetic operation such as the decoding processing.

Figure 14:
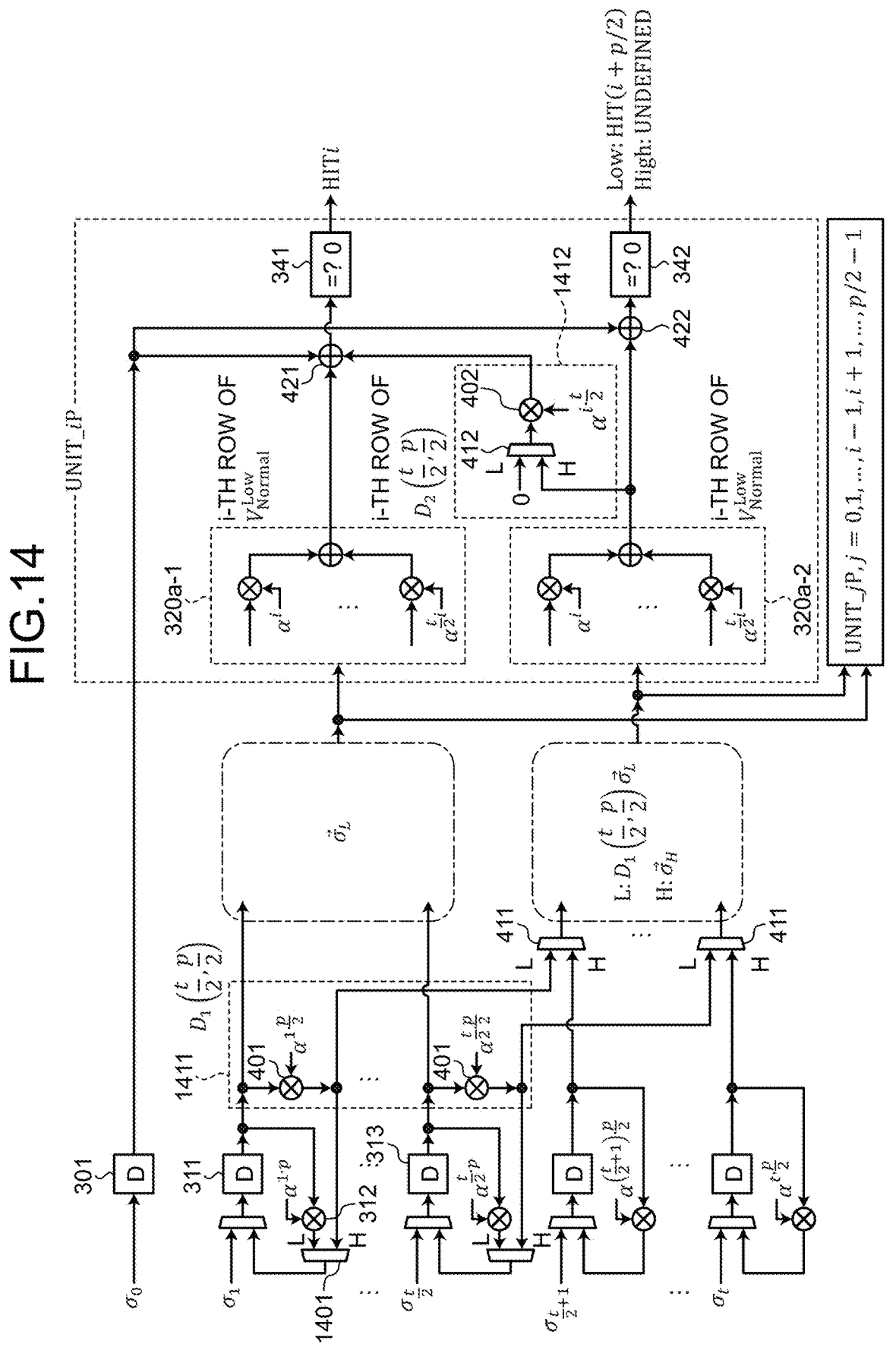
FIG. 14 is a block diagram illustrating a more detailed configuration example of the error position calculation unit.

FIG. 14 is a block diagram illustrating a more detailed configuration example of the error position calculation unit 103. The same components as those in other drawings such as FIGS. 3 and 12 are denoted by the same reference numerals, and description thereof is omitted.

A selector 1401 selects the output of the multiplier 401, namely, the result of multiplication of the diagonal matrix $D_1(t/2, p/2)$ when the number of errors is large, and selects the output of the multiplier 312 when the number of errors is small.

An arithmetic unit 1411 corresponds to an arithmetic unit for performing multiplication of the diagonal matrix $D_1(t/2, p/2)$. An arithmetic unit 1412 corresponds to an arithmetic unit for performing multiplication of the diagonal matrix $D_2(t/2, p/2)$.

Note that UNIT_iP means a circuit that calculates $\sigma(x_i)$ and $\sigma(x_{i+p/2})$ and outputs HITi and HIT(i+p) when the number of errors is small, and calculates $\sigma(x_i)$ and outputs HITi when the number of errors is large. "UNIT_jP, j=0, 1, . . . i–1, i+1, . . . , p/2–1" in FIG. 14 indicates that these circuits are included in the error position calculation unit 103.

Heretofore, the example in which t coefficients of the t-th-order error locator polynomial are divided into first-order to (t/2)-th-order coefficients and (t/2+1)-th-order to t-th-order coefficients has been mainly described. In short, the example of the case where t is an even number of 2 or more has been described. However, t is not necessarily an even number, and may be an odd number of 3 or more.

Figure 15:
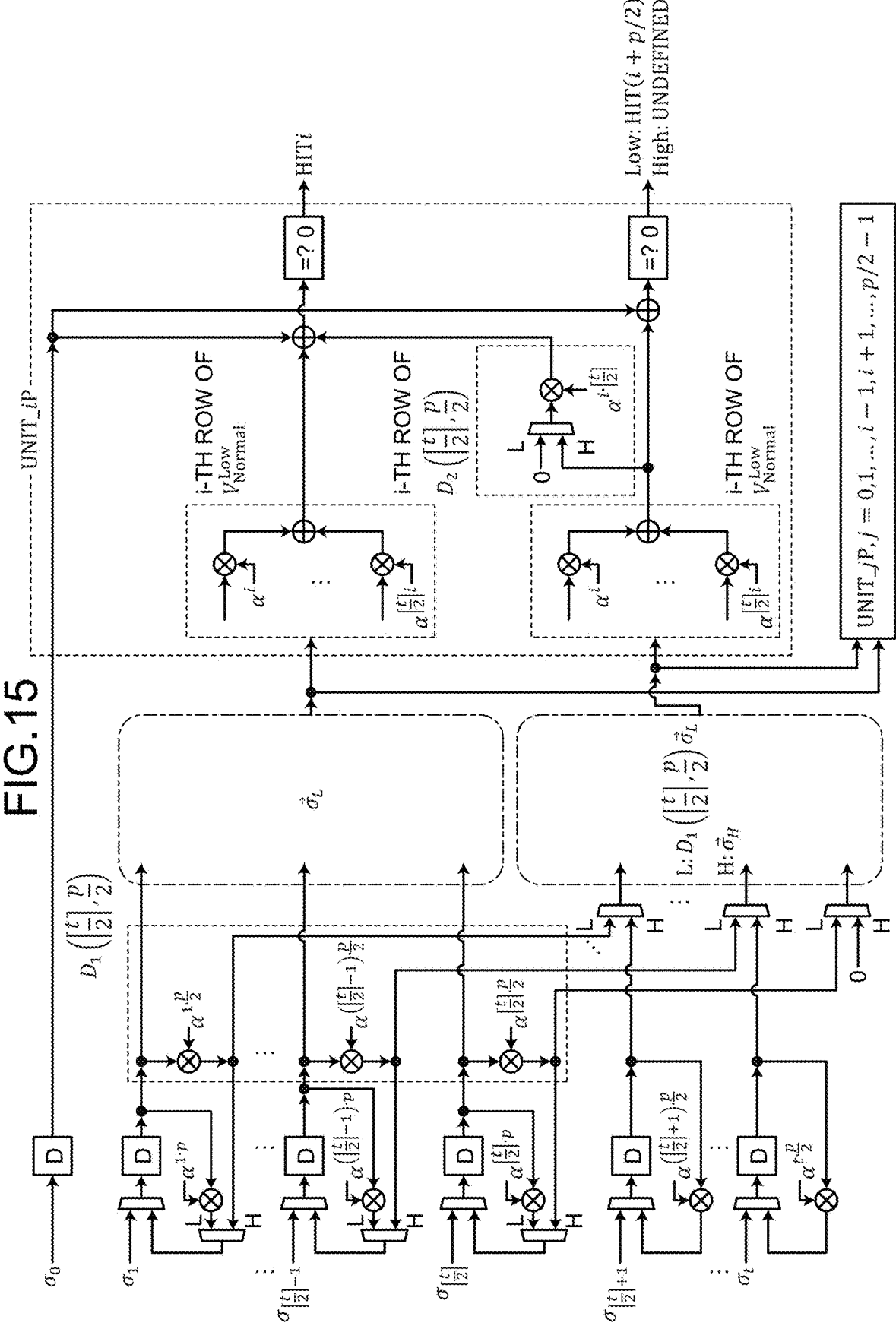
FIG. 15 is a block diagram illustrating a more detailed configuration example of the error position calculation unit.
Figure 16:
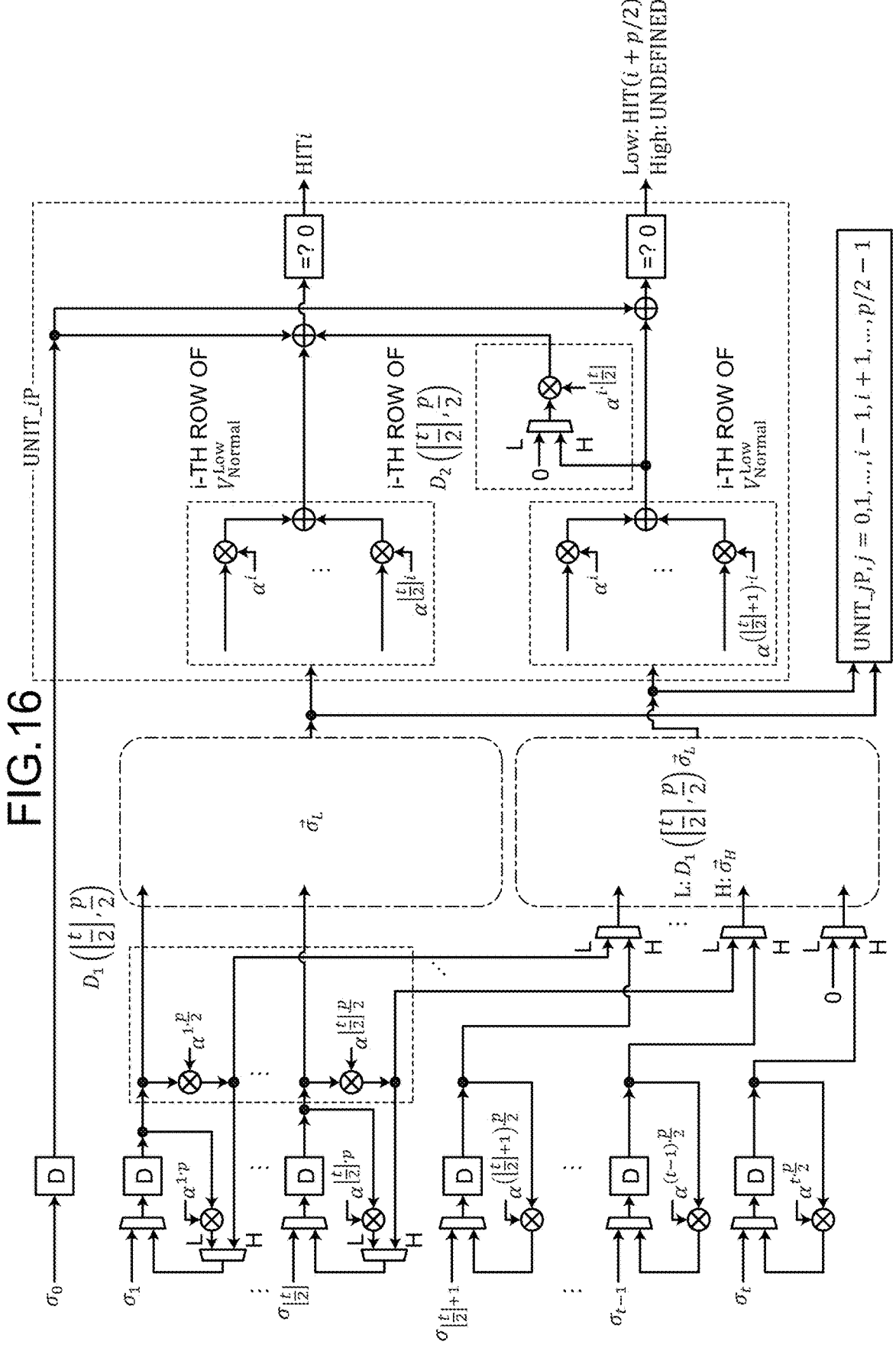
FIG. 16 is a block diagram illustrating a more detailed configuration example of the error position calculation unit.

When t is an odd number, t coefficients can be divided into first-order to s-th-order coefficients and (s+1)-th-order to t-th-order coefficients. s is the minimum integer larger than t/2 or the maximum integer smaller than t/2. FIG. 15 is a block diagram illustrating a configuration example of the error position calculation unit 103 in the former case. FIG. 16 is a block diagram illustrating a configuration example of the error position calculation unit 103 in the latter case. In a case where t is an odd number, a procedure similar to the above can be applied by setting first-order to s-th-order coefficients as low-order coefficients and setting (s+1)-th-order to t-th-order coefficients as higher-order coefficients.

Figure 17:
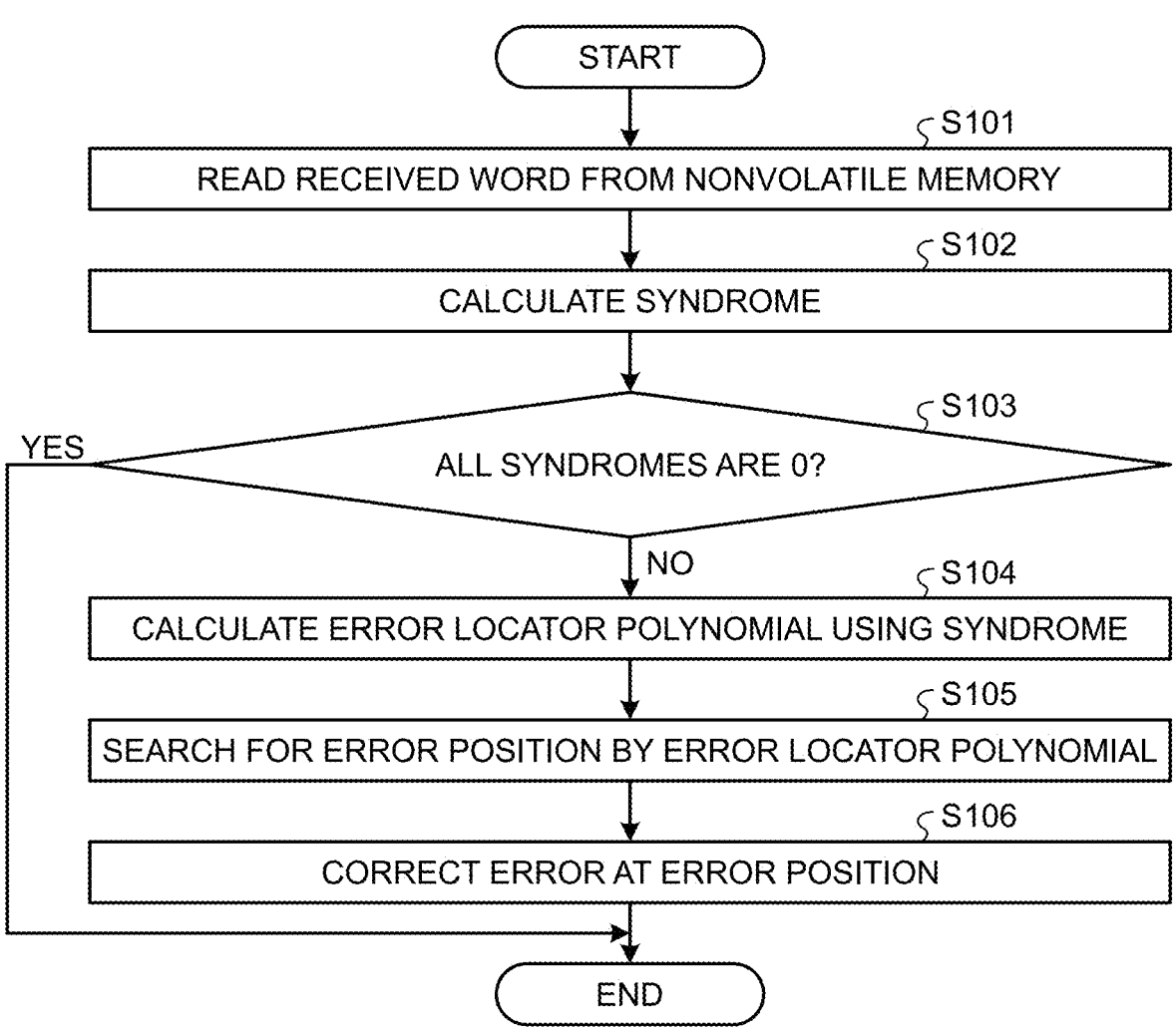
FIG. 17 is a flowchart illustrating an example of decoding processing according to the embodiment.

Next, a flow of decoding processing by the memory system 1 will be described. FIG. 17 is a flowchart illustrating an example of decoding processing according to the present embodiment.

The control unit 11 reads an error correction code from the nonvolatile memory 20, and obtains a received word (step S101). The control unit 11 instructs the decoder 18 to start decoding.

The syndrome calculation unit 101 of the decoder 18 calculates the syndrome from the received word (step S102). The decoder 18 determines whether values of all calculated syndromes are 0 (step S103).

In a case where all the syndromes are 0 (step S103: Yes), since it can be determined that there is no error in the received word, the decoder 18 ends the decoding processing. In a case where all the syndromes are not 0 (step S103: No), the error locator polynomial calculation unit 102 calculates the error locator polynomial using the syndromes (step S104).

The error position calculation unit 103 searches for an error position by the calculated error locator polynomial (step S105). The correction unit 104 corrects the error by inverting (bit flipping) a bit at the error position obtained by the search (step S106), and ends the decoding processing.

As described above, the present embodiment can suppress the size of the circuit used for the search processing of the root of the error locator polynomial by the Chien search or the like. Thus, it is possible to suppress the size of the arithmetic circuit used for the arithmetic operation such as the decoding processing.

While certain embodiments have been described, these embodiments have been presented by way of example only, and are not intended to limit the scope of the inventions. Indeed, the novel embodiments described herein may be embodied in a variety of other forms; moreover, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An arithmetic circuit comprising:
a first substitution circuit configured to calculate p/2 first evaluation values by substituting p/2 check values into a first input polynomial, p being an even integer satisfying 2≤p<n, n being an integer of 2 or more, the first input polynomial being represented by first-order to s-th-order coefficients of an error locator polynomial for an error correction code, s being the minimum integer greater than or equal to t/2 or the maximum integer less than or equal to t/2, t being an integer of 2 or more, the error correction code having a code length of n bits to correct an error of t bits or less; and
a second substitution circuit configured to calculate p/2 second evaluation values,
wherein the arithmetic circuit is configured to, when the number of errors is t/2 or less, output p pieces of error position information including
p/2 pieces of error position information calculated based on the first evaluation values calculated by the first substitution circuit by substituting p/2 first check values from the first to the p/2-th among the p check values, and
p/2 pieces of error position information calculated based on the second evaluation values calculated by the second substitution circuit by substituting the first check values into a second input polynomial, the second input polynomial being represented by coefficients obtained by converting the coefficients of the first input polynomial, and
wherein the arithmetic circuit is configured to, when the number of errors is larger than t/2,
convert the second evaluation values into third evaluation values, the second evaluation values being calculated by the second substitution circuit by substituting the first check values into a third input polynomial represented by (s+1)-th-order to t-th-order coefficients of the error locator polynomial, and output p/2 pieces of error position information calculated based on the first evaluation values, the first evaluation values being calculated by the first substitution circuit by substituting the first check values and the third evaluation values.

2. The arithmetic circuit according to claim 1, wherein the arithmetic circuit is configured to, when the number of errors is t/2 or less, obtain the coefficients of the second input polynomial by multiplying the k-th-order coefficient of the first input polynomial by a primitive element $\alpha$ to the power of (kp/2), k being an integer satisfying $1 \leq k \leq t/2$.

3. The arithmetic circuit according to claim 1, wherein the arithmetic circuit is configured to, when the number of errors is larger than t/2, calculate the third evaluation values by multiplying the p/2 second evaluation values by predetermined p/2 multiplication values, respectively.

4. The arithmetic circuit according to claim 1, wherein the first substitution circuit is configured to substitute p/2 check values in parallel into the first input polynomial to calculate the p/2 first evaluation values, and the second substitution circuit is configured to substitute p/2 check values in parallel into the second input polynomial or the third input polynomial to calculate the p/2 second evaluation values.

5. The arithmetic circuit according to claim 1, wherein the arithmetic circuit is configured to calculate p/2 fourth evaluation values by adding the first evaluation values calculated by the first substitution circuit and the third evaluation values, and calculate the p/2 pieces of error position information by using the fourth evaluation values.

6. The arithmetic circuit according to claim 1, wherein the error correction code is a Bose-Chaudhuri-Hocquenghem (BCH) code or a Reed-Solomon (RS) code.

\* \* \* \* \*